United States Patent
Abe et al.

(10) Patent No.: US 8,967,222 B2
(45) Date of Patent: Mar. 3, 2015

(54) LEAD WIRE CONNECTION APPARATUS AND CONNECTION METHOD OF SEMICONDUCTOR CELLS

(75) Inventors: Mitsuhito Abe, Ebina (JP); Tomoyoshi Kawasaki, Himeji (JP)

(73) Assignee: Shibaura Mechatronics Corporation (JP)

( * ) Notice: Subject to any disclaimer, the term of this patent is extended or adjusted under 35 U.S.C. 154(b) by 629 days.

(21) Appl. No.: 13/308,947

(22) Filed: Dec. 1, 2011

(65) Prior Publication Data

US 2012/0077302 A1 Mar. 29, 2012

Related U.S. Application Data

(63) Continuation of application No. PCT/JP2010/058765, filed on May 24, 2010.

(30) Foreign Application Priority Data

Jun. 3, 2009 (JP) ................................. 2009-134312

(51) Int. Cl.
*B32B 37/00* (2006.01)
*H01L 31/18* (2006.01)
*H01L 21/67* (2006.01)

(52) U.S. Cl.
CPC ........ *H01L 31/188* (2013.01); *H01L 21/67132* (2013.01); *Y02E 10/50* (2013.01); *H01L 2924/0002* (2013.01)
USPC ...................................... 156/581; 156/583.1

(58) Field of Classification Search
USPC ................................ 156/228, 580, 581, 583.1
See application file for complete search history.

(56) References Cited

U.S. PATENT DOCUMENTS

| 5,084,107 A | 1/1992 | Deguchi et al. |
| 2003/0127124 A1 | 7/2003 | Jones et al. |

(Continued)

FOREIGN PATENT DOCUMENTS

| CN | 1938865 A | 3/2007 |
| EP | 2020688 A2 | 2/2009 |

(Continued)

OTHER PUBLICATIONS

Extended European Search Report dated Jun. 28, 2013 issued in counterpart European Patent Application No. EP 10783287.5.

(Continued)

*Primary Examiner* — James Sells
(74) *Attorney, Agent, or Firm* — Volpe and Koenig, P.C.

(57) ABSTRACT

Convey means for pitch-feeding the semiconductor cell to which the conductive tapes have been attached, lead wire processing means for forming-processing the lead wire, provisional pressure-bonding means which is provided at a part opposed to the semiconductor cell that is pitch-fed, holds the lead wires which are forming-processed, repeats provisional pressure-bonding of the lead wires to the conductive tapes provided on the upper surface and lower surface of the semiconductor cell that is pitch-fed, and alternately connects the upper surfaces and lower surfaces of the neighboring semiconductor cells, and main pressure-bonding means which is disposed on a downstream side of the provisional pressure-bonding means in a direction of conveyance of the semiconductor cell, and which mainly pressure-bonds, simultaneously, the paired upper and lower lead wires which have been provisionally pressure-bonded to the upper surface and lower surface of the semiconductor cell.

12 Claims, 20 Drawing Sheets

(56) References Cited

U.S. PATENT DOCUMENTS

2007/0079862 A1    4/2007  Kawagoe et al.
2010/0181011 A1*  7/2010  Hashimoto et al. ........... 156/166

FOREIGN PATENT DOCUMENTS

| | | |
|---|---|---|
| EP | 2169725 A1 | 3/2010 |
| EP | 2234181 A2 | 9/2010 |
| JP | 03-006867 | 1/1991 |
| JP | 2000022188 A | 1/2000 |
| JP | 2005-101519 | 4/2005 |
| JP | 2009-283606 | 12/2009 |
| TW | 200905902 A | 2/2009 |
| WO | 2009-011209 | 1/2009 |
| WO | 2009011209 A1 | 1/2009 |

OTHER PUBLICATIONS

International Search Report issued on Jun. 16, 2010 in parent application No. PCT/JP2010/058765.

Office Action dated Oct. 11, 2013 issued in corresponding Chinese Patent Application No. 201080024084.2 (English Translation Provided).

Office Action issued in corresponding Chinese Patent Application No. 201080024084.2 on Apr. 4, 2014, consisting of 17 pp. (English translation provided).

English translation of International Preliminary Report on Patentability and Written Opinion of the International Searching Authority mailed Jan. 26, 2012 in counterpart International Patent Application No. PCT/JP2010/058765.

* cited by examiner

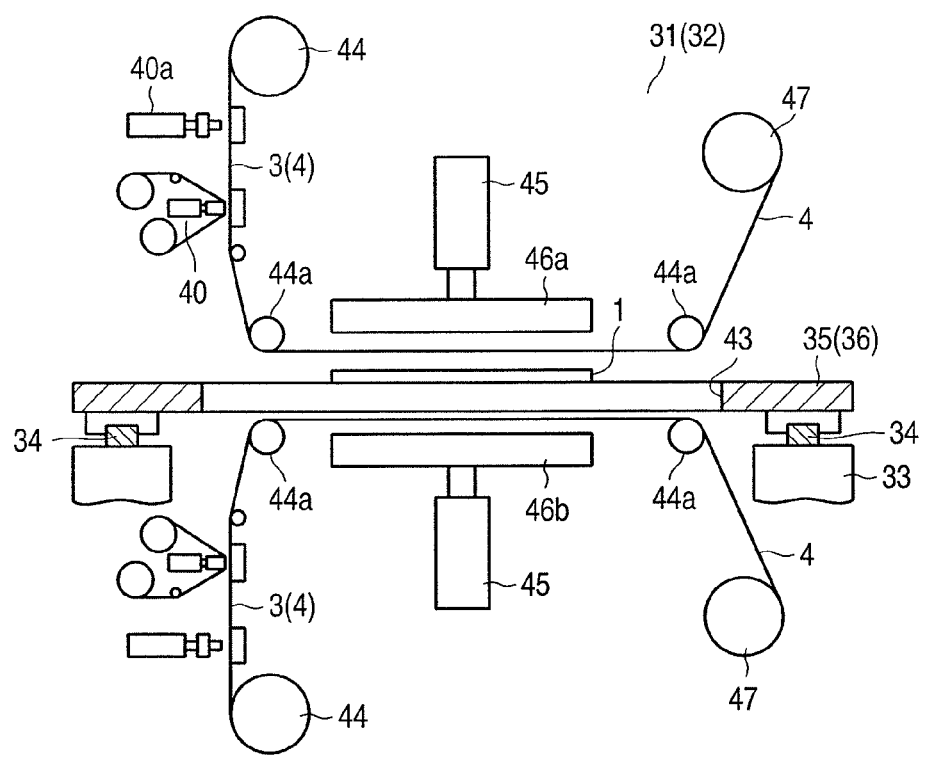
F I G. 4

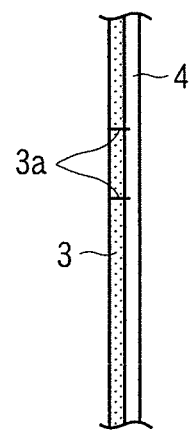
F I G. 5A
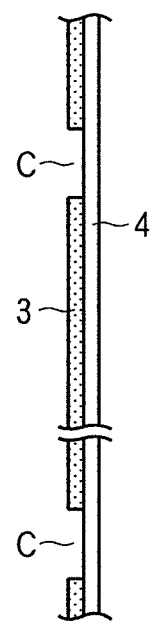
F I G. 5B

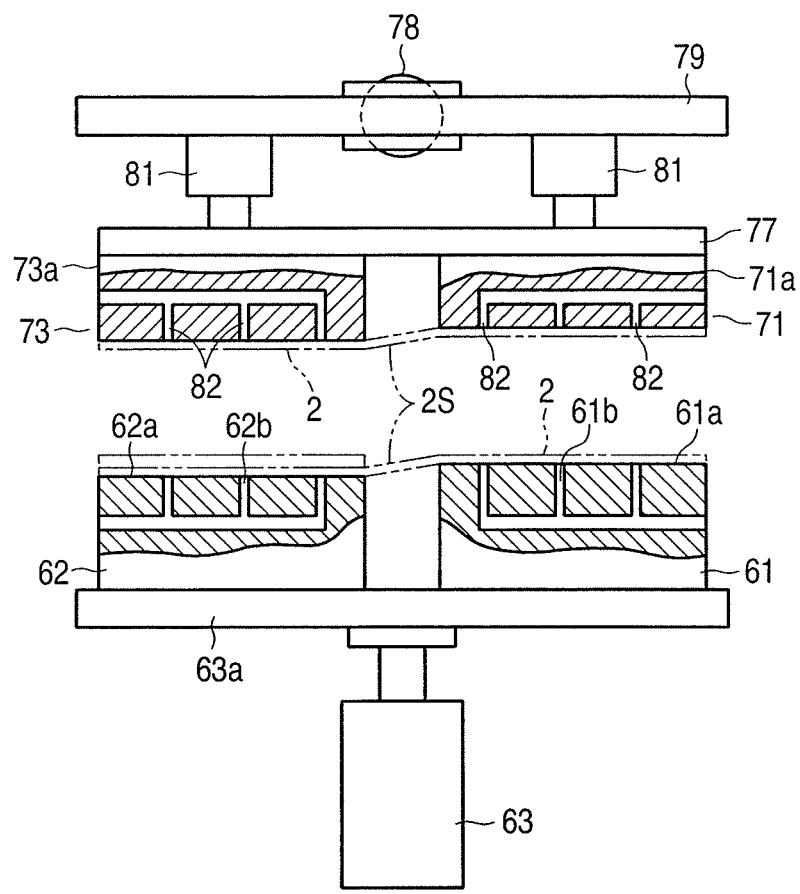
F I G. 9

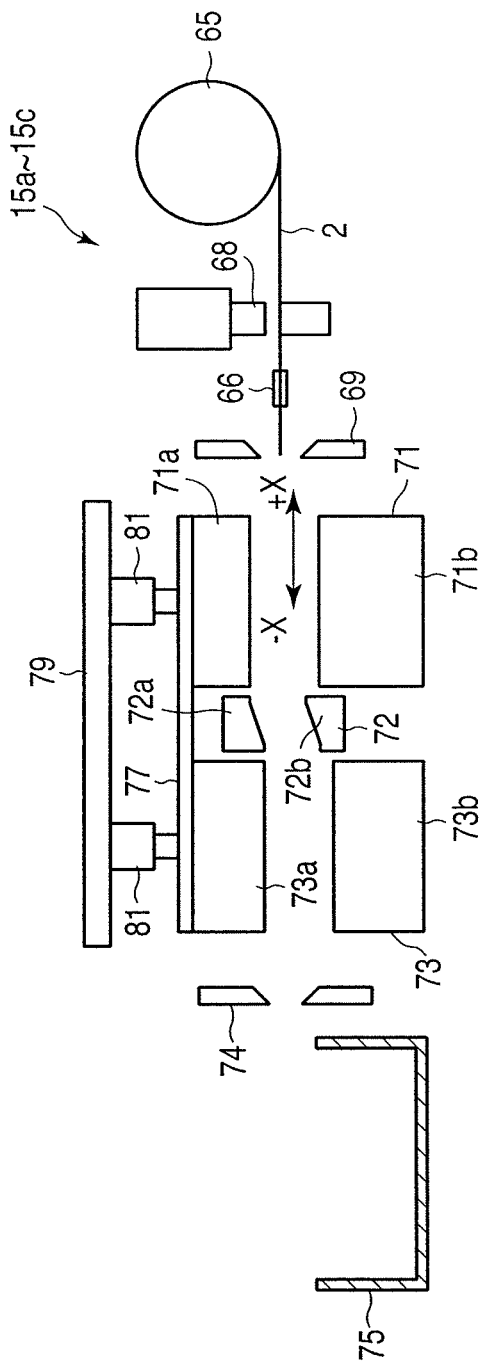
F I G. 10A

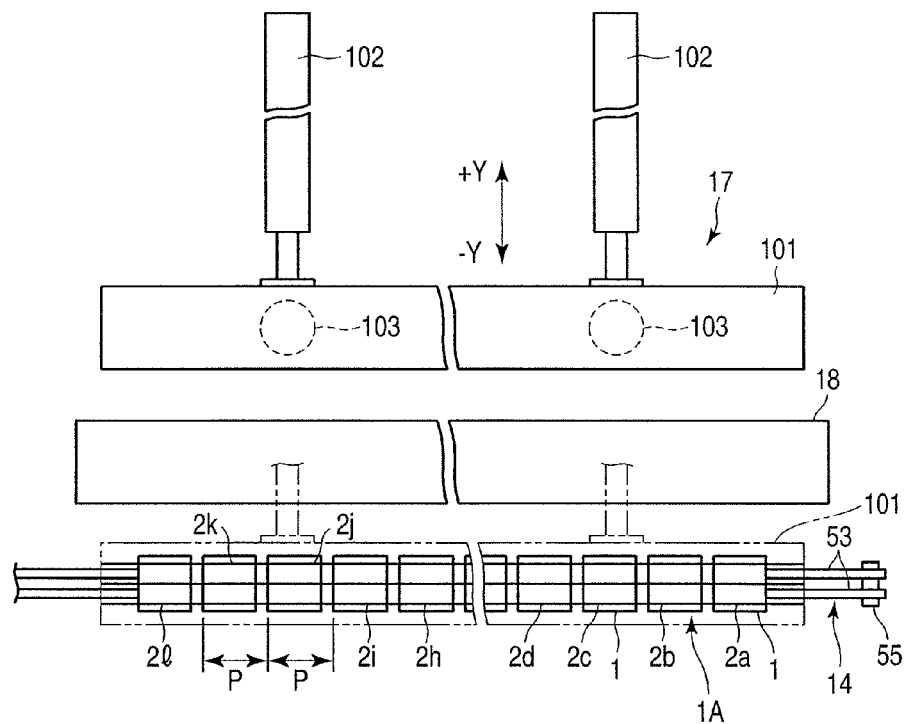
F I G. 13
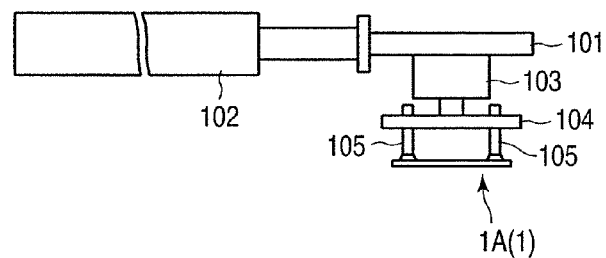
F I G. 14

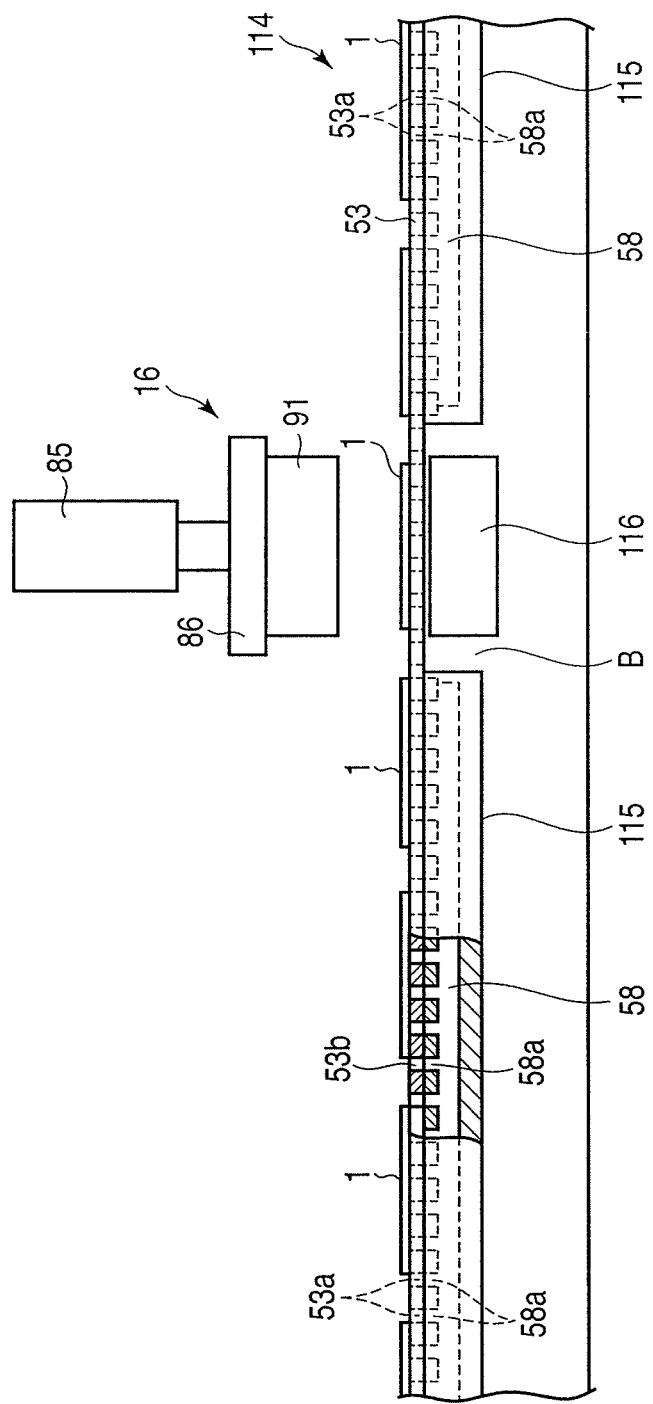
F I G. 16

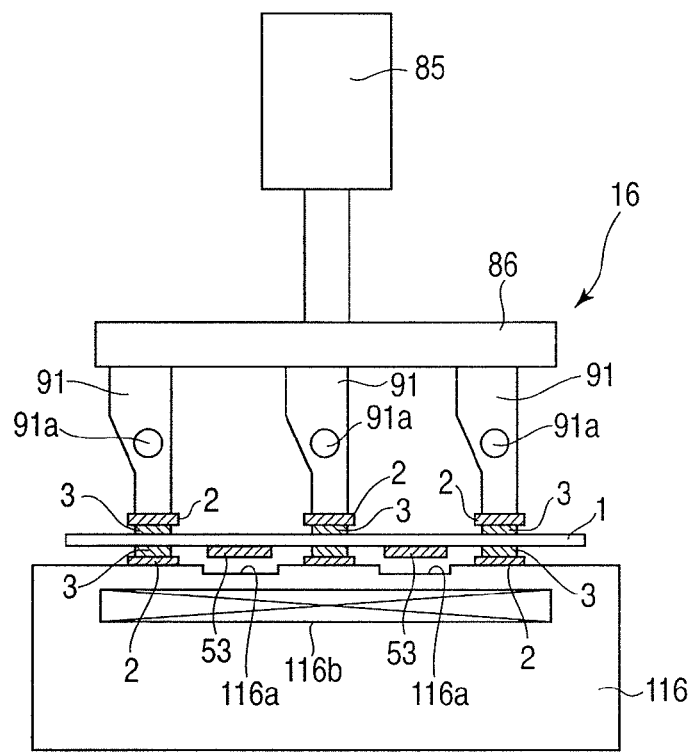
F I G. 18
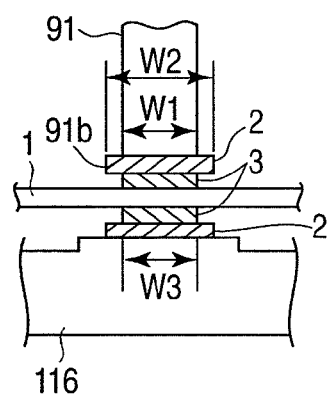
F I G. 19

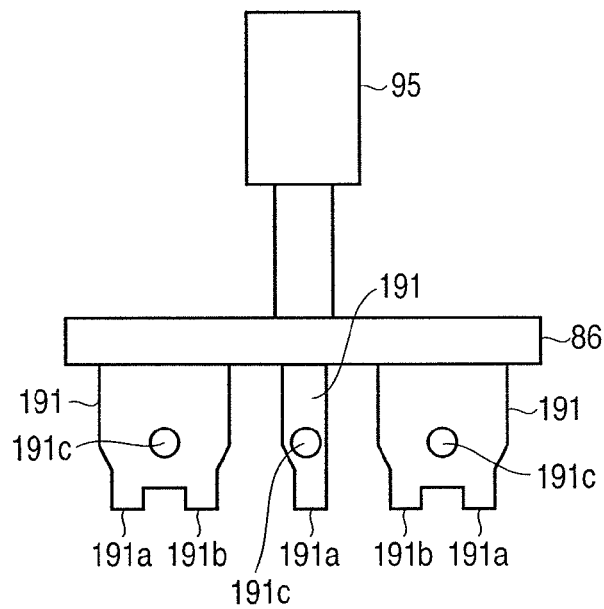
F I G. 20
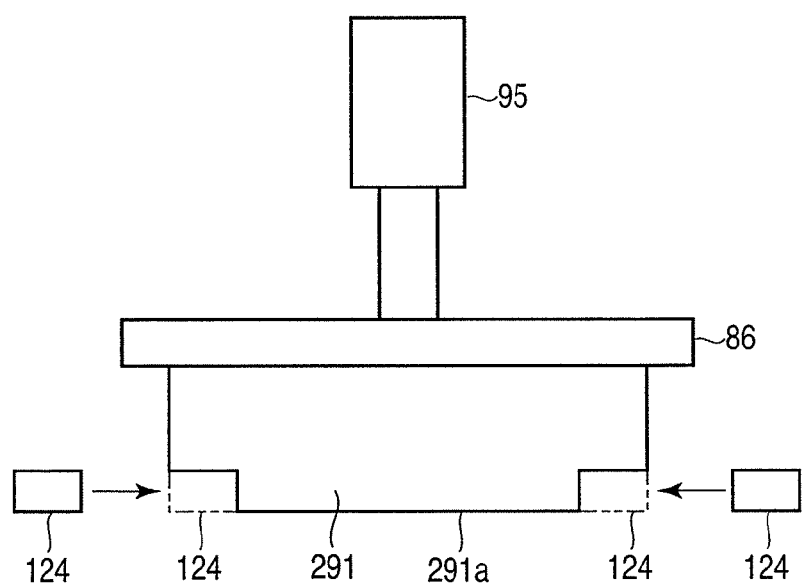
F I G. 21

LEAD WIRE CONNECTION APPARATUS AND CONNECTION METHOD OF SEMICONDUCTOR CELLS

CROSS-REFERENCE TO RELATED APPLICATIONS

This application is a Continuation Application of PCT Application No. PCT/JP2010/058765, filed May 24, 2010 and based upon and claiming the benefit of priority from prior Japanese Patent Application No. 2009-134312, filed Jun. 3, 2009, the entire contents of all of which are incorporated herein by reference.

BACKGROUND OF THE INVENTION

1. Field of the Invention

The present invention relates to a lead wire connection apparatus and connection method for connecting, in a row, a plurality of semiconductor cells for use in a solar battery module by lead wires.

2. Description of the Related Art

Solar battery modules are classified into a crystal type and a thin-film type. A crystal-type solar battery module is configured such that semiconductor cells of, e.g. single-crystal silicon or polycrystalline silicon are connected in a row by lead wires, and the semiconductor cells are integrally laminated on a glass substrate by a resin. Patent literature 1 discloses a solar battery module of this structure.

The solar battery module disclosed in patent literature 1 is configured such that two solar battery cells, which are semiconductor cells, are electrically connected by a strip-shaped lead wire, which is a connection member that is bent in a crank shape, via a conductive member, for example, an electrically conductive tape, which is disposed on the surfaces of the semiconductor cells.

The connection of the two semiconductor cells by the lead wire is such that one end portion of the lead wire is connected to the conductive tape that is provided on an upper surface of one of the semiconductor cells, and the other end portion of the lead wire is connected to the conductive tape that is provided on a lower surface of the other semiconductor cell.

Patent literature 1 shows that the two semiconductor cells are connected by the lead wire. However, in the case where the output of the solar battery module is to be improved, for example, the number of semiconductor cells to be connected is not two, but is increased to ten or more, and many semiconductor cells are connected in a row by lead wires.

FIG. 15A is a plan view showing a state in which many semiconductor cells 1 (1a to 1n) are connected in a row by lead wires 2 (2a to 2n), and FIG. 15B is a side view in enlarged scale. As shown in FIG. 15B, electrically conductive tapes 3, as described above, which are formed of a thermosetting resin with adhesive properties, are attached in advance to the upper and lower surfaces of each of the semiconductor cells 1a to 1n, and the lead wires 2a to 2n are provisionally pressure-bonded to the conductive tapes 3.

Then, the lead wires 2a to 2n are heated while being pressed with a greater pressing force than at the time of the provisional pressure-bonding. Thereby, since the conductive tapes 3 are melted and cured, the lead wires 2a to 2n are mainly pressure-bonded, that is, connected and fixed, to the upper and lower surfaces of the semiconductor cells 1a to 1n.

CITATION LIST

Patent Literature

Patent literature 1: Jpn. Pat. Appln. KOKAI Publication No. 2005-101519.

As described above, when the plural semiconductor cells 1a to 1n are connected in a row by the lead wires 2a to 2n via the conductive tapes 3, it is desired that the productivity be enhanced by automating the connecting work.

However, conventionally, no apparatus has been developed which automates the work of connecting the plural semiconductor cells 1a to 1n by the lead wires 2a to 2n.

In the case where the work of connecting the plural semiconductor cells 1a to 1n by the lead wires 2a to 2n is automated, it is thinkable that since the semiconductor cells 1a to 1n are fragile crystals of single-crystal silicon or polycrystalline silicon, the semiconductor cells 1a to 1n would be damaged if the semiconductor cells 1a to 1n are inadvertently pressed or heated at the time of adhesion of conductive tapes or at the time of provisional pressure-bonding or main boding of the lead wires 2a to 2n, or deformation or strain would occur due to non-uniform thermal expansion at the time of main pressure-bonding.

BRIEF SUMMARY OF INVENTION

Technical Problem

The present invention aims at providing a lead wire connection apparatus and connection method of semiconductor cells, which automate the work of connecting a plurality of semiconductor cells by lead wires, and which prevent occurrence of deformation or strain due to heat.

Solution to Problem

In order to solve the above-described problem, the present invention provides a lead wire connection apparatus which connects a plurality of semiconductor cells in a row by lead wires, comprising:

a feed module which feeds the semiconductor cells;

tape attaching means for simultaneously attaching adhesive, electrically conductive tapes, which are cut to a predetermined length, to an upper surface and a lower surface of the semiconductor cell which is fed from the feed module;

convey means to which the semiconductor cell, to the upper surface and lower surface of which the conductive tapes have been attached by the tape attaching means, is fed, and which pitch-feeds the semiconductor cell;

lead wire processing means for forming-processing the lead wire in such a shape that the lead wire is bent upward and downward at an intermediate portion in a longitudinal direction of the lead wire;

provisional pressure-bonding means which is provided at a part opposed to the semiconductor cell that is pitch-fed by the convey means, holds the lead wires, which are forming-processed by the lead wire processing means, repeats provisional pressure-bonding of the lead wires to the conductive tapes provided on the upper surface and lower surface of the semiconductor cell that is pitch-fed, and electrically connects, alternately, the upper surfaces and lower surfaces of the neighboring semiconductor cells; and main pressure-bonding means which is disposed at a part opposed to the semiconductor cell on a downstream side of the provisional pressure-bonding means in a direction of conveyance of the semiconductor cell by the convey means, and which mainly pressure-bonds, simultaneously, the paired upper and lower lead wires which have been provisionally pressure-bonded to the upper surface and lower surface of the semiconductor cell by the provisional pressure-bonding means.

In order to solve the above-described problem, the present invention provides a lead wire connection method of connecting a plurality of semiconductor cells in a row by lead wires, comprising:

simultaneously attaching adhesive, electrically conductive tapes, to an upper surface and a lower surface of the semiconductor cell;

provisionally pressure-bonding one end portion of one of two the lead wires and an other end portion of the other of the two lead wires, simultaneously, to the conductive tapes attached to the upper surface and lower surface of the semiconductor cell, and electrically connecting, alternately, the upper surfaces and lower surfaces of the neighboring semiconductor cells; and mainly pressure-bonding, simultaneously, the paired upper and lower lead wires which have been provisionally pressure-bonded to the upper surface and lower surface of the semiconductor cell.

BRIEF DESCRIPTION OF THE SEVERAL VIEWS OF THE DRAWINGS

FIG. 4 is a side view showing a tape attachment module for attaching electrically conductive tapes on upper and lower surfaces of a semiconductor cell which is fed to the attachment table.

FIG. 5A is an explanatory view at a time of cutting to a predetermined length an adhesive tape which is attached to a release tape.

FIG. 5B is, similarly, an explanatory view at a time of cutting to a predetermined length the adhesive tape which is attached to the release tape.

FIG. 9 is a partly cross-sectional side view showing a pair of a lower block and an upper block, which provisionally pressure-bond lead wires on the upper and lower surfaces of the semiconductor cell in the invention.

FIG. 10A shows a state before the lead wire forming-process means forming-processes the lead wire.

FIG. 13 is a plan view showing discharge means for discharging, from the convey means, a string which is formed while semiconductor cells are being conveyed by the convey means.

FIG. 14 is a side view of the discharge means.

FIG. 16 is a front view showing a part of convey means according to a second embodiment of the invention.

FIG. 18 is a side view showing an upper pressing tool of main pressure-bonding means.

FIG. 19 is an enlarged view of one upper pressing tool of the main pressure-bonding means shown in FIG. 18.

FIG. 20 is a side view showing an upper pressing tool according to a third embodiment of the invention.

FIG. 21 is a front view showing an upper pressing tool according to a fourth embodiment of the invention.

DETAILED DESCRIPTION OF THE INVENTION

Figure 1:
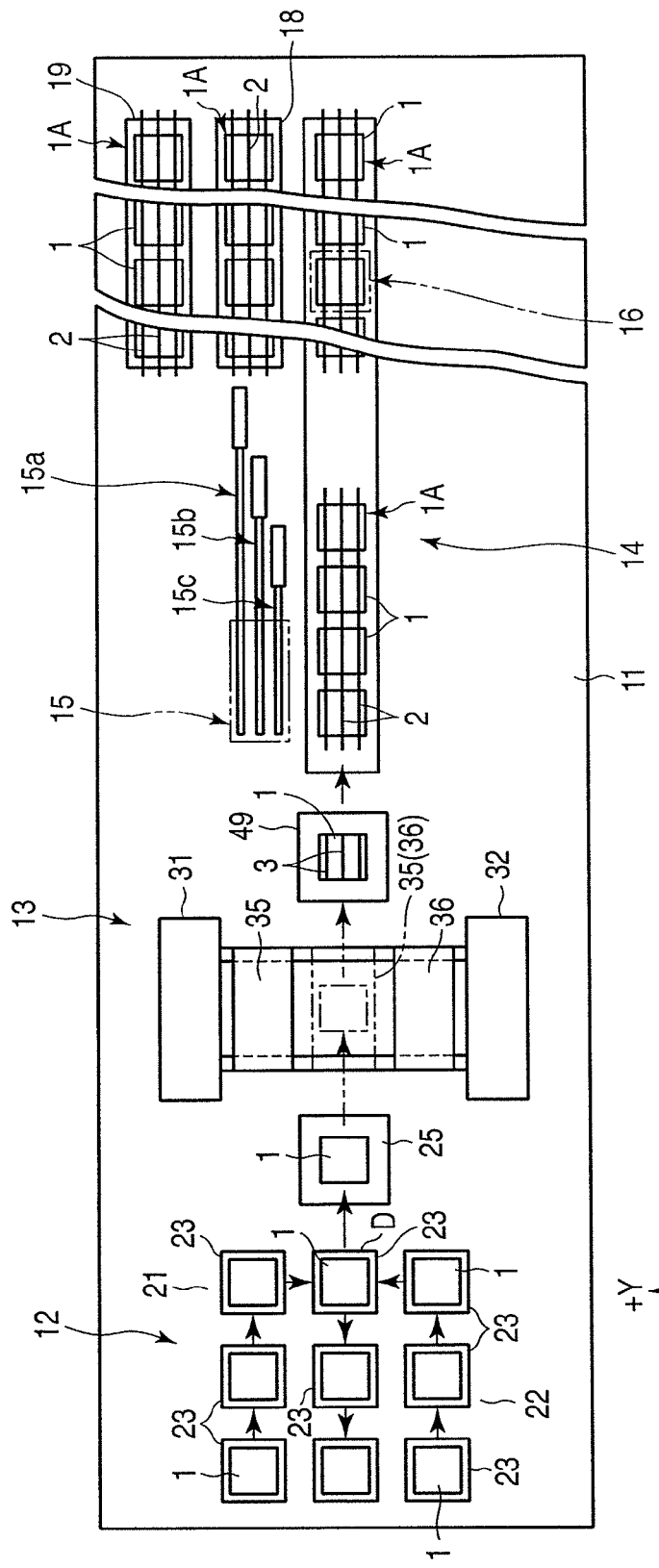
FIG. 1 is a plan view which schematically shows the structure of a lead wire connection apparatus of a first embodiment of the invention.

Embodiments of the invention will now be described with reference to the accompanying drawings. FIG. 1 to FIG. 14 show a first embodiment of the invention. To begin with, the schematic structure of the entire apparatus is described. FIG. 1 is a plan view which schematically shows the structure of a lead wire connection apparatus. The connection apparatus includes a rectangular-plate-shaped base member 11. On the upper surface of the base member 1, there are successively provided, from one end toward the other end in the longitudinal direction, a feed module 12 of semiconductor cells 1; tape attaching means 13 for attaching electrically conductive tapes 3 to upper and lower surfaces of the semiconductor cells 1; and convey means 14 for intermittently pitch-conveying the semiconductor cells 1, to the upper and lower surfaces of which the conductive tapes 3 have been attached by the tap attaching means 13.

In the meantime, the conductive tape 3 is formed in a tape shape by mixing electrically conductive particles of a metal, etc. in a synthetic resin having adhesive properties.

On a lateral side of one end portion of the convey means 14, there are disposed three lead wire processing means 15a to 15c for forming-processing, in a crank shape, lead wires 2 for connecting a plurality of semiconductor cells 1 in a row, which are successively fed to the convey means 14.

The lead wires 2, which have been forming-processed in a crank shape by the lead wire processing means 15a to 15c, are provisionally pressure-bonded to the semiconductor cells 1, which are conveyed by the convey means 14, by provisional pressure-bonding means 15 which is disposed above the one end portion of the convey means 14. As will be described later, by the repetition of the provisional pressure-bonding of the lead wires 2, the plural semiconductor cells 1 are conveyed by the convey means 14 while being successively connected in a row.

A plurality (three in this embodiment) of main pressure-bonding means 16 (simply indicated by a chain line in FIG. 5), which simultaneously main pressure-bond the lead wires 2, which have been provisionally pressure-bonded by the provisional pressure-bonding means 15, to the upper and lower surfaces of the semiconductor cells 1, are arranged at predetermined intervals on a downstream side of the provisional pressure-bonding means 15 in the direction of conveyance of the convey means 14. For example, when the number of semiconductor cells 1, which are connected in a row, is 12, the interval of arrangement of the three main pressure-bonding means 16 is an integer multiple, i.e. three times, of a connection pitch P of the semiconductor cells 1.

Then, when the 12 semiconductor cells 1 are connected in a row, the three main pressure-bonding means 16 are opposed to the first, fifth and ninth semiconductor cells 1 in the convey direction, and simultaneously main pressure-bond the lead wires 2, which have been provisionally pressure-bonded, to these three semiconductor cells 1.

Next, if the 12 semiconductor cells 1, which are connected in a row, are pitch-fed by a distance of P, the three main pressure-bonding means 16 main pressure-bond the lead wires 2, which have been provisionally pressure-bonded, to the second, sixth and tenth semiconductor cells 1. When this main pressure-bonding is repeated four times, the lead wires 2, which have been provisionally pressure-bonded to the 12 semiconductor cells 1, are main pressure-bonded.

On a lateral side of the other end portion of the convey means 14, there is provided discharge means 17 (shown in FIG. 13 and FIG. 14 as will be described later) for sucking and discharging, from the convey means 14, the 12 semiconductor cells 1 to which the lead wires 2 have been mainly pressure-bonded by the main pressure-bonding means 16 and have been connected in a row (the semiconductor cells 1 connected in a row are referred to as "string 1A").

The connection state of the lead wires 2 of the string 1A, which has been conveyed out from the convey means 14 by the discharge means 17, is inspected by image recognition by an inspection module 18 shown in FIG. 1, and then the string 1A is contained in a stocker 19 and conveyed out.

Next, the structures of the respective parts are described.

In the feed module 12, as shown in FIG. 1, a first storage 21 and a second storage 22 are provided spaced apart in a direction ("Y direction") which crosses the convey direction ("X direction") of the convey means 14. The X direction and Y direction are indicated by arrows in FIG. 1.

Each storage 21, 22 includes cassettes 23. The above-described semiconductor cell 1 is provided in each cassette 23. The cassettes 23 of each storage 21, 22 are pitch-fed in a +X direction. At the terminal ends of the storages 21 and 22, the cassettes 23 of one storage 21 and the other storage 22 are alternately fed in a −Y direction and a +Y direction, and are positioned at a delivery position D which is the center of the storages 21 and 22 in the Y direction.

Figure 6:
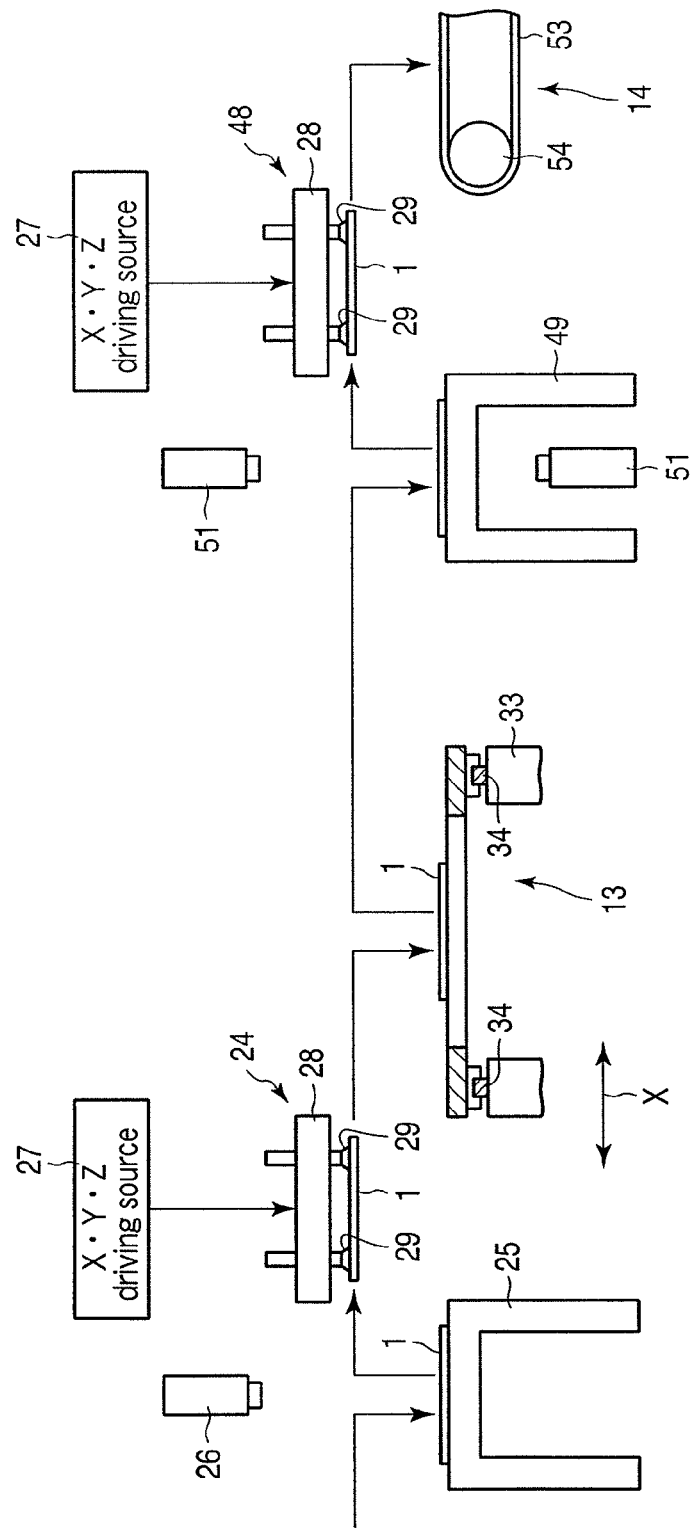
FIG. 6 is a view for describing the order of conveyance of the semiconductor cell from a feed module to convey means by first and second delivery devices.

The semiconductor cell 1 of the cassette 23, which is positioned at the delivery position D, is sucked by a first delivery device 24 shown in FIG. 6, and is delivered to an alignment stage 25. The semiconductor cell 1, which is fed onto the alignment stage 25, is photographed by a camera 26 which is disposed thereabove, and an external appearance inspection and position recognition are performed based on the photographed image.

If the external appearance of the semiconductor cell 1 is determined to be defective, for example, if the presence of a crack is determined, the semiconductor cell 1 is discharged by the first delivery device 24, based on an instruction from a control device (not shown). If the semiconductor cell 1 is determined to be non-defective, the semiconductor cell 1 is fed alternately to a first attachment table 35 or a second attachment table 36 (to be described later) of the tape attaching means 13 by the first delivery device 24.

The cassette 23, which is empty after the semiconductor cell 1 has been taken out by the first delivery device 24 at the delivery position D, is moved in a −X direction and discharged at the terminal end. Then, a semiconductor cell 1 is fed to the cassette 23, and the cassette 23 is restored to the first or second storage 21, 22, and the above-described operation is repeated.

The first delivery device 24, as shown in FIG. 6, includes a movable member 28 which is driven by an X·Y·Z driving source 27 in the horizontal direction and vertical direction. The movable member 28 is provided with four suction pads 29 (only two are shown) which suck four corner portions of the upper surface of the semiconductor cell 1.

Thereby, the first delivery device 24 can move and convey the semiconductor cell 1 by sucking, by the four suction pads 29, the four corner portions of the upper surface of the semiconductor cell 1 of the cassette 23 at the delivery position D.

The semiconductor cell 1, which has undergone the external appearance inspection and position recognition on the alignment stage 25, is fed to the tape attaching means 13 by the first delivery device 24.

In the meantime, the movement of the semiconductor cell 1 from the alignment stage 25 to the tape attaching means 13 may be performed not by the first delivery device 24, but by another delivery device, and there is no restriction in this respect.

The tape attaching means 13, as shown in FIG. 1, includes a first tape attachment module 31 and a second tape attachment module 32, which have the same structure and are symmetrically arranged spaced apart in the Y direction, with the convey means 14 being set at the center. The first and second tape attachment modules 31 and 32 are constructed, as shown in FIG. 2 to FIG. 5.

Specifically, the tape attaching means 13 includes a frame 33 which is disposed along the Y direction. A pair of Y guide rails 34 are provided at both end portions in the width direction in the X direction on the upper surface of the frame 33, as indicated by the arrow in FIG. 3. The first attachment table 35 and second attachment table 36 are provided on the Y guide rails 34 so as to be movable along the Y guide rails 34.

Figure 2:
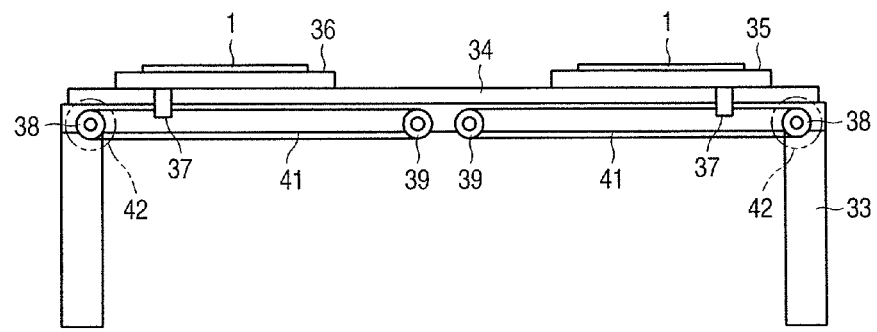
FIG. 2 is a side view of a frame which is provided with an attachment table of tape attaching means.
Figure 3:
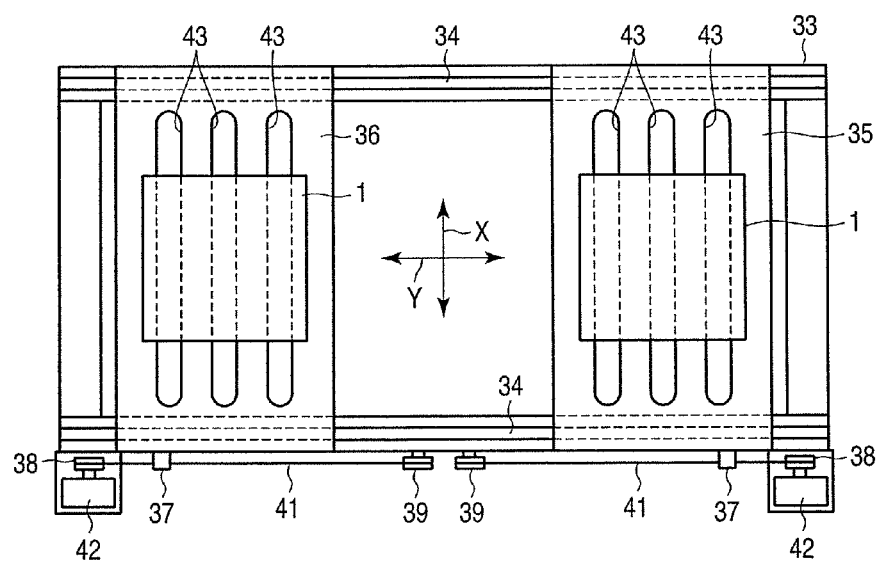
FIG. 3 is a plan view of the frame shown in FIG. 2.

As shown in FIG. 2 and FIG. 3, a coupling portion 37 is provided on a lower surface of one end portion in the with direction of each attachment table 35, 36. An endless belt 41, which is passed over a driving pulley 38 and a driven pulley 39, is coupled to each coupling portion 37. Each of the paired driving pulleys 38 is rotated and driven by a motor 42.

Thereby, the first attachment table 35 can be reciprocally driven between one end portion and a central portion in the Y direction of the frame 33, and the second attachment table 36 can be reciprocally driven between the other end portion and the central portion in the Y direction of the frame 33. In FIG. 1, each attachment table 35, 36, which is moved to the central portion in the Y direction of the frame 33, is denoted by a chain line.

As shown in FIG. 3, in each of the first and second attachment tables 35 and 36, three through-holes 43, which penetrate the upper and lower surfaces, are formed. The through-holes 43 are elongated in the X direction, and are formed at predetermined intervals along the Y direction.

As shown in FIG. 1, the above-described first tape attachment module 31 is provided at one end portion in the Y direction of the frame 33, and the second tape attachment module 32 is provided at the other end portion. As shown in FIG. 4, the respective tape attachment modules 31 and 32 include feed reels 44 which are disposed above and below one end portion in the X direction of each attachment table 35, 36. The electrically conductive tape 3, which is attached on a release tape 4, as shown in FIG. 5A and FIG. 5B, is wound around the feed reel 44.

A pair of cut lines 3a, shown in FIG. 5A, are formed by a cutting mechanism 40a, which is composed of a cutter, in the conductive tape 3 which is led out from the feed reel 44 together with the release tape 4. The pair of cut lines 3a are formed in the conductive tape 3 at a predetermined interval, that is, at an interval corresponding to the width dimension of the semiconductor cell 1.

That part of the conductive tape 3, which has been cut by the pair of cut lines 3a, is removed by a cut-out mechanism 40, and thus a clearance C shown in FIG. 5B is formed. Thereby, the conductive tape 3 is cut to a length corresponding to the width dimension of the semiconductor cell 1. Since the cut-out mechanism 40 is publicly known art, a detailed description thereof is omitted here.

The conductive tapes 3, which have been cut to the predetermined length in this manner, are guided together with the release tapes 4 to pairs of guide rollers 44a, and run in parallel to the upper and lower surfaces of the first and second attachment tables 35 and 36.

An upper pressing tool 46a and a lower pressing 46b, which are vertically driven by upper and lower driving sources 45, such as cylinders, are disposed above and below the part at which the conductive tapes 3 run in parallel.

The semiconductor cell 1, which has been fed onto the alignment stage 25 and subjected to the external appearance inspection and position recognition, is fed and placed onto the first or second attachment table 35, 36, which is positioned at the central part of the frame in the Y direction, from the alignment stage 25 by the first delivery device 24.

If the first attachment table 35 or second attachment table 36, onto which the semiconductor cell 1 has been fed and placed, is driven from the central part of the frame in the Y direction to one end portion or the other end portion thereof, the upper pressing tool 46a and lower pressing tool 46b are simultaneously driven upward and downward.

Thereby, the pressing tools 46a and 46b simultaneously contact, press and attach those parts of the conductive tapes 3, which have been cut to the predetermined length, via the release tapes 4, to the upper surface and lower surface of the semiconductor cell 1. Subsequently, the release tape 4 is released from the conductive tape 3 that is attached to the semiconductor cell 1, for example, by a releasing roller (not shown), and is wound around a take-up reel 47.

Specifically, the semiconductor cells 1, which have been subjected to the external appearance inspection and position recognition on the alignment stage 25, are alternately fed to the first attachment table 35 and second attachment table 36, and the conductive tapes 3 are attached to the semiconductor cells 1 by the first tape attachment module 31 and second tape attachment module 32.

Each of the first and second tape attachment modules 31 and 32 includes three pairs of feed reels 44, take-up reels 47 and upper and lower pressing tools 46a and 46b, which are disposed above and below each of the first and second attachment tables 35 and 36. Thereby, three conductive tapes 3 are simultaneously pressed and attached to each of the upper and lower surfaces of the semiconductor cell 1 by the upper and lower pressing tools 46a and 47b which simultaneously come in contact with these conductive tapes 3.

Since the conductive tapes 3 are simultaneously pressed and attached to the upper and lower surfaces of the semiconductor cell 1, the conductive tapes 3 can be precisely aligned and attached to the upper and lower surfaces of the semiconductor cell 1 once the semiconductor cell 1 is positioned.

Specifically, the conductive tapes 3 are attached to the upper and lower surfaces of the semiconductor cell 1. Thus, in the case where the conductive tapes 3 are attached to one surface of the semiconductor cell 1 and then the semiconductor cell 1 is turned upside down and the conductive tapes 3 are attached to the other surface of the semiconductor cell 1, misalignment would occur when the semiconductor cell 1 is turned upside down, and the conductive tapes 3 could not precisely be aligned and attached to the upper and lower surfaces, or the productivity would deteriorate due to complication of the mechanism for turning the semiconductor cell 1 upside down or the time needed for turning the semiconductor cell 1 upside down.

However, as described above, since the conductive tapes 3 are simultaneously attached to the upper and lower surfaces of the semiconductor cell 1, the precision of attachment and the productivity can be improved, and the mechanisms can be simplified.

In the meantime, the number of conductive tapes 3, which are attached to each of the upper and lower surfaces of the semiconductor cell 1, is not limited to three, and may be two or four. This number is set in accordance with the structure of the semiconductor cell 1.

In addition, in the case where the number of conductive tapes 3, which are attached to each of the upper and lower surfaces of the semiconductor cell 1, is plural, the conductive tapes 3 may be provisionally pressure-bonded, one by one, to the upper and lower surfaces of the semiconductor cell 1. In this case, each of the first and second tape attachment modules 31 and 32 is provided with a pair of feed reels 44, take-up reels 47 and upper and lower pressing tools 46a and 46b, and it should suffice if each of the first and second attachment tables 35 and 36 is moved in the Y direction by a predetermined distance each time one conductive tape 3 has been attached, and then the next conductive tape 3 is attached.

In short, the structure of each tape attachment module 31, 32 can be simplified or reduced in size by the structure wherein each tape attachment module 31, 32 is provided with only one pair of feed reels 44, take-up reels 47 and upper and lower pressing tools 46a and 46b.

If the three conductive tapes 3 are attached to each of the upper and lower surfaces of the semiconductor cells 1 which are fed to the first tape attachment module 31 and second tape attachment module 32, the first attachment table 35 and second attachment table 36, on which the semiconductor cells 1 are placed, are alternately driven and positioned to the central part from the one end portion and other end portion in the Y direction of the frame 33.

The semiconductor cell 1 on the first attachment table 35 or second attachment table 36, which has been positioned at the central part of the frame 33, is sucked and held by a second delivery device 48 which is horizontally and vertically driven, as shown in FIG. 6, and is fed to an attachment inspection stage 49 which is provided between the tape attaching means 13 and the convey means 14.

In the meantime, since the structure of the second delivery device 48 is identical to the structure of the first delivery device 24, the same parts are denoted by like reference numerals and a description thereof is omitted.

In the attachment inspection stage 49, the attachment states of the conductive tapes 3, which are attached to the upper and lower surfaces of the semiconductor cell 1, such as the presence/absence of peeling, are simultaneously photographed and inspected on the upper and lower sides by imaging cameras 51 which are disposed in the upward and downward directions. If the result of photography by the imaging cameras 51 indicates a defect, the semiconductor cell 1 is discharged based on an instruction from a control device (not shown). If the result of photography by the imaging cameras 51 indicates no defect, the semiconductor cell 1 is fed to the convey mean 14 by the second delivery device 48.

Figure 7:
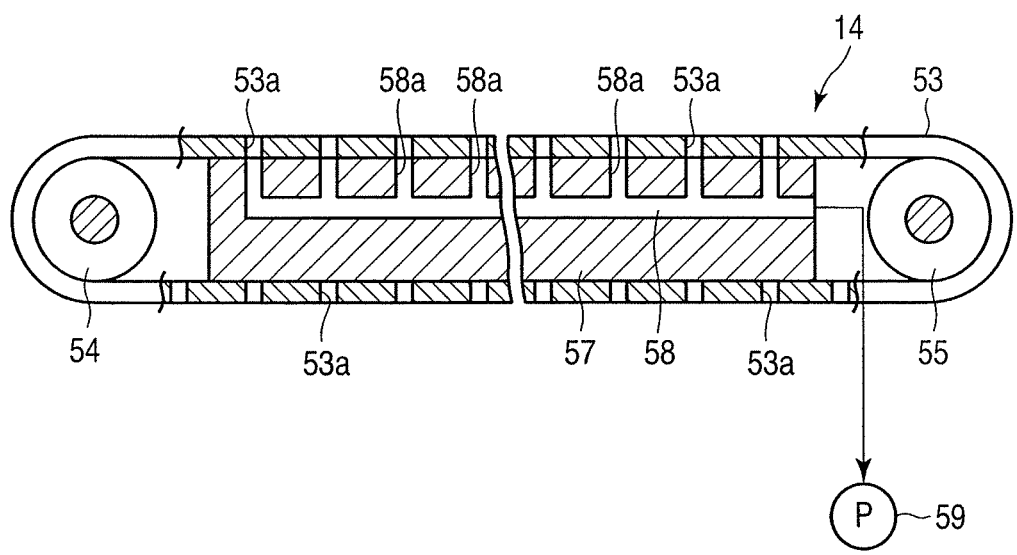
FIG. 7 is a partly cross-sectional side view of an endless belt of the convey means.
Figure 8:
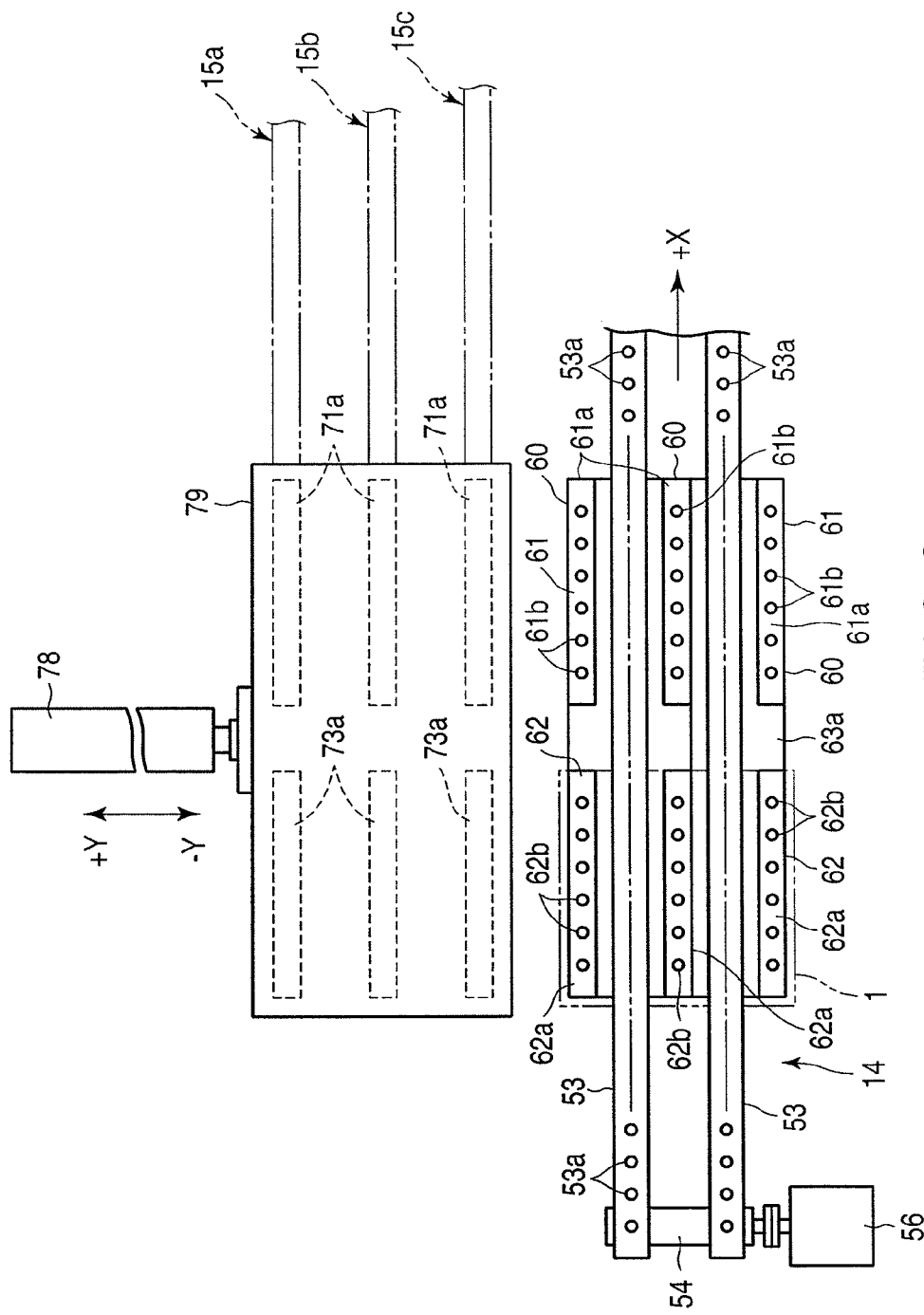
FIG. 8 is a plan view showing the state of arrangement of convey means and first and second upper blocks which constitute provisional pressure-bonding means which is disposed above lead wire processing means on a lateral side of the convey means.

As shown in FIG. 7 or FIG. 13, the convey means 14 includes a pair of endless belts 53 which are spaced apart in the Y direction with an interval which is less than the width dimension of the semiconductor cell 1. As shown in FIG. 7, the endless belt 53 is passed between a driving pulley 54 and a driven pulley 55. The driving pulley 54 is rotated and driven by a motor 56, which is shown in FIG. 8, so that the upper surface side of the endless belt 53 runs from the −X direction toward the +X direction. The direction of running of the endless belt 53 is indicated by an arrow of +X in FIG. 8.

The endless belts 53 are intermittently driven with a predetermined pitch P. The pitch P is set to be equal to an interval, indicated by P in FIG. 13, of neighboring semiconductor cells 1 which are connected in a row by the lead wires 2.

As shown in FIG. 7 and FIG. 8, a great number of suction holes 53a, which penetrate the endless belt 53 in the thickness direction, are provided at predetermined intervals in the X direction. A block 57 is provided between the upper and lower inner surfaces of the endless belt 53 such that the upper and lower surfaces of the block 57 are put in contact with those parts of the endless belt 53, which are located at the upper and lower parts of the inner peripheral surface of the endless belt 53. A suction conduit 58 is formed in the block 57 along the longitudinal direction.

A plurality of branch ports 58a, which are branched from the suction conduit 58 and are open to the upper surface of the block 57, are formed at intervals corresponding to the suction holes 53a provided in the endless belt 53. Incidentally, the branch ports 58a may also be formed to open to the lower surface of the block 57.

One end of the suction conduit 58 is closed, and the other end thereof is connected to a suction pump 59. Thereby, when the suction pump 59 operates, a suction force occurs in the suction holes 53a of the endless belt 53 via the suction conduit 58 and branch ports 58a.

In the meantime, the interval of the suction holes 53a is set to be equal to an integer fraction of the pitch P at which the endless belt 53 is intermittently driven, or to be equal to the pitch P. Thereby, if the suction holes 53a of the endless belt 53 are set to correspond to the branch ports 58a of the block 57 before the endless belt 53 is driven, the suction holes 53a are opposed to the branch ports 58a at all times even when the endless belt 53 is intermittently driven.

Thereby, when the lead wires 2 are provisionally pressure-bonded or mainly pressure-bonded to the semiconductor cell 1, the positioned semiconductor cell 1 can be held on the endless belt 53 without a positional error.

As shown in FIG. 8, three sets of lower pressing members 60, in total, which constitute the provisional pressure-bonding means 15, are provided between the pair of endless belts 53 and on the outsides of the endless belts 53, at one end portion in the −X direction of the endless belts 53 which constitute the convey means 14.

Each of the three sets of lower pressing members 60 comprises a first lower block 61 and a second lower block 62 which are disposed spaced apart by a predetermined distance in the X direction. The respective blocks, i.e. six blocks 61 and 62 in total, are integrally attached and fixed to the upper surface of an attachment plate 63a which is vertically moved by vertical driving means 63 (shown in FIG. 9) such as a cylinder.

The upper end surface of the first lower block 61 is formed to be a first reception surface 61a which is flat, and the upper end surface of the second lower block 62 is formed to be a second reception surface 62a which is flat and is formed at a position slightly lower than the first reception surface 61a.

Suction ports 61b and 62b are formed in the first reception surface 61a and second reception surface 62a. A suction force can be produced in the suctions ports 61b and 62b by a suction pump not shown.

The lead wires 2, which are forming-processed in a crank shape by the first to third lead wire processing means 15a to 15c, which are provided on the lateral side of one end portion of the convey mean 14, are simultaneously fed onto the upper surfaces of the three sets of lower blocks 61 and 62.

Figure 10B:
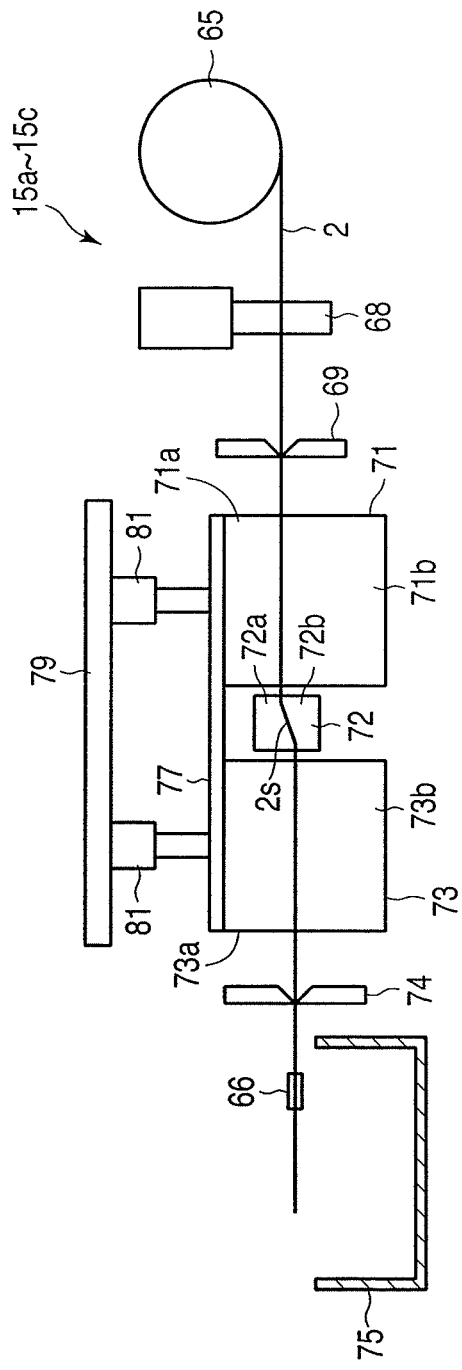
FIG. 10B shows a state in which the lead wire forming-process means is forming-processing the lead wire.

As shown in FIG. 10A and FIG. 10B, each of the lead wire processing means 15a to 15c includes a feed reel 65 on which the lead wire 2 is wound. The lead wire of the feed reel 65 is clamped and led out by a lead-out gripper 66. The lead wire 2 has a strip shape.

The lead-out gripper 66 is reciprocally driven in the X direction indicated by an arrow in FIG. 10, by a cylinder or a wire, not shown, which runs endlessly. Thereby, the lead wire 2 is lead out in the −X direction from the feed reel 65.

The lead wire 2, which has been led out by the lead-out gripper 66 in the −X direction, is passed through a clamper 68, a first cutter 69, a first holding module 71 divided into a first upper block 71a and a second lower block 71b, a forming die 72 comprising a pair of upper and lower dies 72a and 72b, a second holding module 73 divided into a second upper block 73a and a second lower block 73b, and a second cutter 74. A discard box 75 is disposed on the downstream side of the second cutter 74 in the lead-out direction.

The first upper block 71a of the first holding module 71 and the second upper block 73a of the second holding module 73 of each of the first to third lead wire processing means 15a to 15c are attached to a lower surface of an attachment plate 77 shown in FIG. 8 and FIG. 9.

As shown in FIG. 9, a lower end surface of the first upper block 71a of the first holding module 71 is set to be slightly higher than a lower end surface of the second upper block 73a of the second holding module 73. Further, suction ports 82 are formed in the paired upper blocks 71a and 73a, the suction ports 82 being open to the lower end surfaces thereof.

An upper end surface of the first lower block 71b of the first holding module 71 is set to be slightly higher than an upper end surface of the second lower block 73b of the second holding module 73.

The attachment plate 77 is provided so as to be vertically movable by a plurality of vertical cylinders 81 on a lower surface of a plate-shaped movable member 79 shown in FIG. 8 and FIG. 9. The movable member 79 is movable in the Y direction by a horizontal cylinder 78.

The paired upper blocks 71a and 73a serve also as an upper pressing member of the provisional pressure-bonding means 15.

If the lead wire 2 is led out, from the state shown in FIG. 10A, by the lead-out gripper 66 from the feed reel 65 of each of the first to third lead wire processing means 15a to 15c, as shown in FIG. 10B, a proximal end portion of the lead wire 2 on the feed reel 65 side is held by the clamper 68.

At the same time, the first and second upper blocks 71a and 73a of the first holding module 71 and second holding module 73, which stand by above the first to third lead wire processing means 15a to 15c, as shown in FIG. 8, are driven downward by the vertical cylinders 81. The lead wire 2, which is lead out by the lead-out gripper 66 and is yet to be forming-processed, is sucked and held by the suction ports 82 which are open to the lower end surfaces of the upper blocks 71a and 73a.

Then, the forming die 72 operates in a direction of closing, and forms an inclined portion 2s at an intermediate part of the lead wire 2. At the same time, the paired cutters 69 and 74 operate to cut the lead wire 2, which has been led out of the feed reel 65, to a length corresponding to the dimension between the paired cutters 69 and 74. That part of the lead wire 2, which is on the downstream side of the second cutter 74, is discharged to the discard box 75.

In the meantime, although one end portion and the other end portion of the lead wire 2 have different heights due to the inclined portion 2s, the difference in height is a dimension corresponding to the thickness of the semiconductor cell 1, and is very small, for example, about 1 mm.

When the forming and cutting of the lead wire 2 are finished in the first to third lead wire processing modules 15a to 15c, the forming die 72 is driven in a direction of opening and then driven in a horizontal direction perpendicular to the lead wire 2, and retreats from the vertical direction of the lead wire 2. Then, the formed and processed lead wire 2 is sucked and held by the lower end surfaces of the upper blocks 71a and 73a of the first and second holding modules 71 and 73.

Subsequently, the attachment plate 77, to which the upper blocks 71a and 73a are attached, is driven upward by the vertical cylinders 81, and then the movable member 79, to which the attachment plate 77 is attached, is driven in the −Y direction by the horizontal cylinder 78. Thus, the lead wire 2, which is sucked and held on the lower end surfaces of the upper blocks 71a and 73a, is positioned above the first and second blocks 61 and 62 of the lower pressing member 60 which is provided at one end portion of the convey means 14.

Figure 11A:
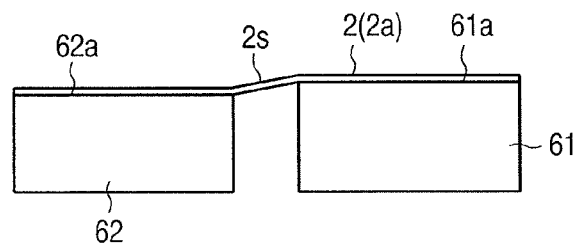
FIG. 11A is a view illustrating a first step of forming a string by successively connecting lead wires to semiconductor cells.

If the forming-processed lead wire 2 is positioned above the first and second blocks 61 and 62 of the lower pressing member 60, the upper blocks 71a and 73a are driven downward and the forming-processed lead wire 2 (2a), as in a first step shown in FIG. 11A, is delivered onto, and sucked and held by, the first and second reception surfaces 61a and 61b that are the upper end surfaces of the first and second blocks 61 and 62.

Figure 11B:
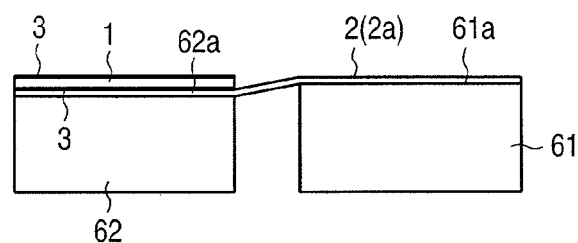
FIG. 11B is a view illustrating a second step of forming the string by successively connecting the lead wires to the semiconductor cells.

After the lead wire 2 is sucked and held by the first and second reception surfaces 61a and 61b, the semiconductor cell 1, to the upper and lower surfaces of which the three conductive tapes 3 are attached, is fed by the second delivery device 48 onto the downwardly bent other end portion of the lead wire 2 which is located on the second reception surface 62a of the second lower block 62, as in a second step shown in FIG. 11B.

Figure 11C:
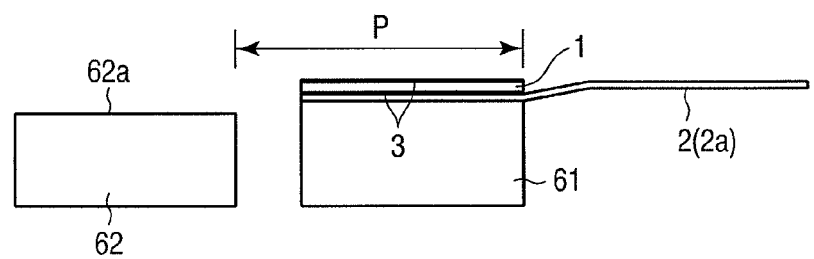
FIG. 11C is a view illustrating a third step of forming the string by successively connecting the lead wires to the semiconductor cells.

If the semiconductor cell 11 is fed onto the other end portion of the lead wire 2, the first and second blocks 61 and 62 are driven downward by the vertical driving means 63 and delivered to the convey means 14, and then the semiconductor cell 1, to the lower surface of which one end portion of the lead wire 2 (2a) has been attached, is intermittently conveyed by the convey means 14 by the distance of pitch P. FIG. 11C shows a third step in this state.

Figure 11D:
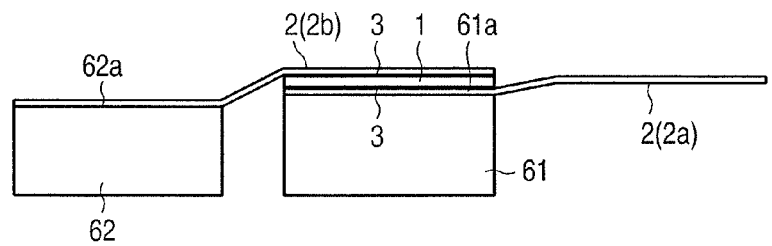
FIG. 11D is a view illustrating a fourth step of forming the string by successively connecting the lead wires to the semiconductor cells.
Figure 11E:
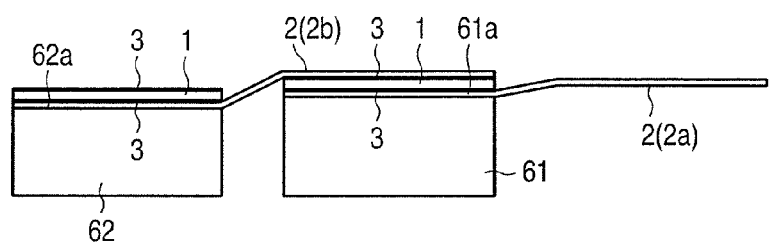
FIG. 11E is a view illustrating a fifth step of forming the string by successively connecting the lead wires to the semiconductor cells.

If the semiconductor cell 1 is pitch-fed, the first lower block 61 and second lower block 62 are driven upward by the vertical driving means 63, as in a fourth step shown in FIG. 11D. Thereby, the semiconductor cell 1, to the lower surface of which the other end portion of the lead wire 2 is attached, is raised from the endless belts 53 of the convey means 14 by the first reception surface 61a of the first lower block 61. Thereafter, the next forming-processed lead wire 2 (2b) is sucked and held by the upper blocks 71a and 73a of the first holding module 71 and second holding module 73, and is fed.

One end portion of the lead wire 2 (2b) is fed to a position corresponding to the conductive tape 3 on the upper surface of the semiconductor cell 1, which is sucked and held, via the lead wire 2 (2a), on the first reception surface 61a of the first lower block 61 of the lower pressing member 60. The other end portion of the lead wire 2 (2b) is fed to the reception surface 62a of the second lower block 62 of the lower pressing member 60.

Thereby, as regards the semiconductor cell 1 which is held on the reception surface 61a of the first lower block 61, the other end portion of the lead wire 2 (2a) which is attached to the lower surface of the semiconductor cell 1 and the one end portion of the lead wire 2 (2b) which is attached to the upper surface of the semiconductor cell 1 are simultaneously pressed by the reception surface 61a of the first lower block 61 and the lower end surface of the first upper block 71a. In short, the other end portion of the lead wire 2 (2a), which was first fed, and the one end portion of the lead wire 2 (2b), which was next fed, are provisionally pressure-bonded at the same time to the upper and lower surfaces of the semiconductor cell 1.

In the meantime, when the first upper block 71a and second upper block 73a take out the lead wires 2 which has been formed by the first to third lead wire processing means 15a to 15c, the pressing force, which is applied to the upper blocks 71a and 73a by the vertical cylinders 81, is set to be higher than the pressure at the time of provisionally pressure-bonding the lead wires 2 to the semiconductor cell 1.

Thereby, the lead wires 2 can surely be taken out from the lead wire processing means 15a to 15c. At the time of the provisional pressure-bonding, since the pressure is lower than at the time of taking-out, the lead wires 2 can be prevented from being misaligned from the conductive tapes 3 attached to the semiconductor cell 1.

Although the first holding module 71 and second holding module 73 are attached to the single attachment plate 77, the respective holding modules 71 and 73 may be attached to different attachment plates and may be vertically driven by the vertical cylinders 81.

In this case, when the lead wire 2 is sucked, the gas pressure that is fed to the vertical cylinders 81 is controlled so that the respective holding modules 71 and 73 may abut on the lead wire 2 with the same pressure. When the semiconductor cell 1 is provisionally pressure-bonded to the lead wire 2, as will be described later, the pressure of gas, which is fed to the paired vertical cylinders 81, is controlled so that the pressure, with which the respective holding modules 71 and 73 press the semiconductor cell 1, may become optimal in accordance with the state at that time. Thereby, damage to the semiconductor cell 1 can be prevented.

In this manner, when the lead wires 2 (2a, 2b) have been provisionally pressure-bonded to the upper and lower surfaces of the semiconductor cell 1 which was first fed, the upper blocks 71a and 73a of the first holding module 71 and second holding module 73 rise and move (retreat) in the +Y direction indicated by the arrow in FIG. 8. Then, as in a fifth step shown in FIG. 11E, the next semiconductor cell 1 is fed by the second delivery device 48 to the other end portion of the lead wire 2 (2b), and the conductive tape 3 on the lower surface is attached to the lead wire 2 (2b).

Then, the first and second blocks 61 and 62 are driven downward, and the two semiconductor cells 1, which are electrically connected by the lead wire 2 (2*b*), are delivered to the endless belts 53. Thereafter, as in a fifth step shown in FIG. 11F, the semiconductor cells 1 are intermittently conveyed by the endless belts 53 by the distance of pitch P.

Subsequently, the upper blocks 71*a* and 73*a*, which suck and hold the forming-processed lead wire 2 at their lower end surfaces, are driven in the −Y direction and positioned above the endless belts 53 of the convey means 14. Then, the upper blocks 71*a* and 73*a* are driven downward and the lead wire 2 (2*c*) is fed as indicated by a chain line in FIG. 11F.

One end portion of the lead wire 2 (2*c*) is fed and positioned on the upper surface of the semiconductor cell 1 on the reception surface 61*a* of the first lower block 61, and the other end portion thereof is fed and positioned on the reception surface 62*a* of the second lower block 62.

Thereby, the other end portion of the lead wire 2 (2*b*) and the one end portion of the lead wire 2 (2*c*) are pressed and provisionally pressure-bonded to the lower and upper surfaces of the semiconductor cell 1 on the reception surface 61*a* of the first lower block 61, by the reception surface 61*a* of the first lower block 61 and the lower end surface of the first upper block 71*a*.

Figure 15A:
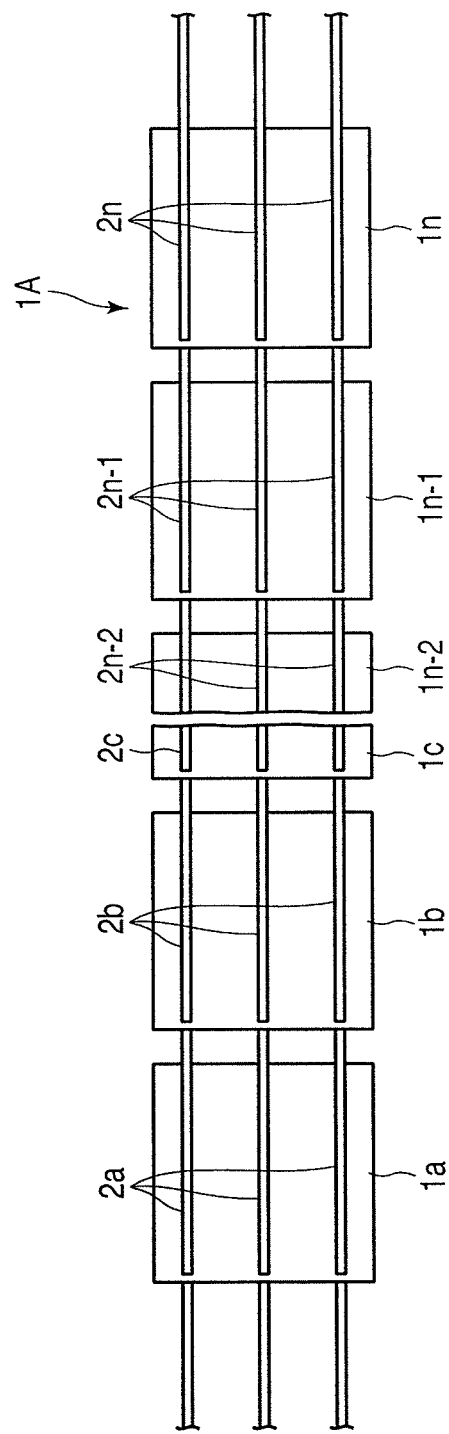
FIG. 15A is a plan view of a string in which semiconductor cells are connected by lead wires.
Figure 15B:
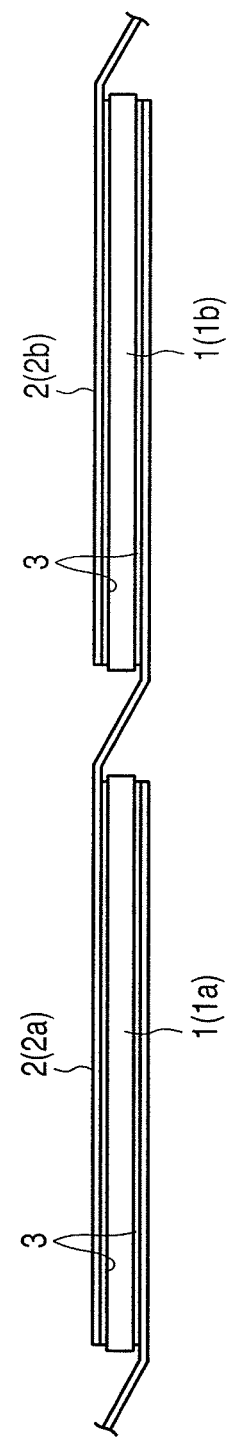
FIG. 15B is an enlarged side view of a part of the string.

By the provisional pressure-bonding being repeated, a plurality of semiconductor cells 1, for example, 12 semiconductor cells 1, are connected by the lead wires 2*a* to 2*n* in a row and formed into the string 1A, as shown in FIG. 15A. Specifically, the string 1A in the provisional pressure-bonded state, in which the lead wires 2 are successively provisionally pressure-bonded, at one end and the other end thereof, to the lower surfaces and upper surfaces of the semiconductor cells 1, is formed.

In the meantime, when the lead wire 2 is provisionally pressure-bonded to the semiconductor cell 1 by the conductive tape 3, fine particles included in the conductive tape 3 are not crushed in some cases. In such cases, the semiconductor cell 1 and lead wire 2 may not electrically be connected by the provisional pressure-bonding.

In this manner, if the string 1A in the provisional pressure-bonded state is formed by successively provisionally pressure-bonding the lead wires 2, at one end and the other end thereof, to the lower surfaces and upper surfaces of the semiconductor cells 1, the number of semiconductor cells 1, which constitute the string 1A, can be set at, not 12, but an arbitrary number.

Figure 11F:
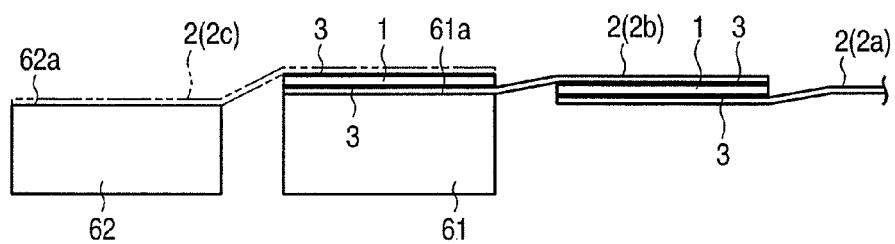
FIG. 11F is a view illustrating a sixth step of forming the string by successively connecting the lead wires to the semiconductor cells.

In addition, as shown in FIG. 11B, FIG. 11D and FIG. 11F, in the case where the lead wire 2 is provisionally pressure-bonded to the semiconductor cell 1 which is provided on either the first block 61 or second block 62, if the first holding module 71 and second holding module 73 are coupled to the vertical cylinders 81 by different attachment plates, as described above, the pressing force, which is applied to one holding module 71 or 73 that provisionally pressure-bonds the lead wire 2 to the semiconductor cell 1, can be made lower than the pressing force which is applied to the other holding module. Thereby, it is possible to prevent the semiconductor cell 1 from being damaged due to excessive pressing.

If the string 1A in the provisional pressure-bonded state, which comprises 12 semiconductor cells 1, is conveyed by the convey means 14 and the foremost semiconductor cell 1 is conveyed to a position corresponding to the main pressure-bonding means 16 at the foremost distal end in the +X direction of the three main pressure-bonding means 16, the lead wires 2, which are provisionally pressure-bonded to the first, fifth and ninth semiconductor cells 1, are mainly pressure-bonded by the three main pressure-bonding means 16 at the same time.

Figure 12:
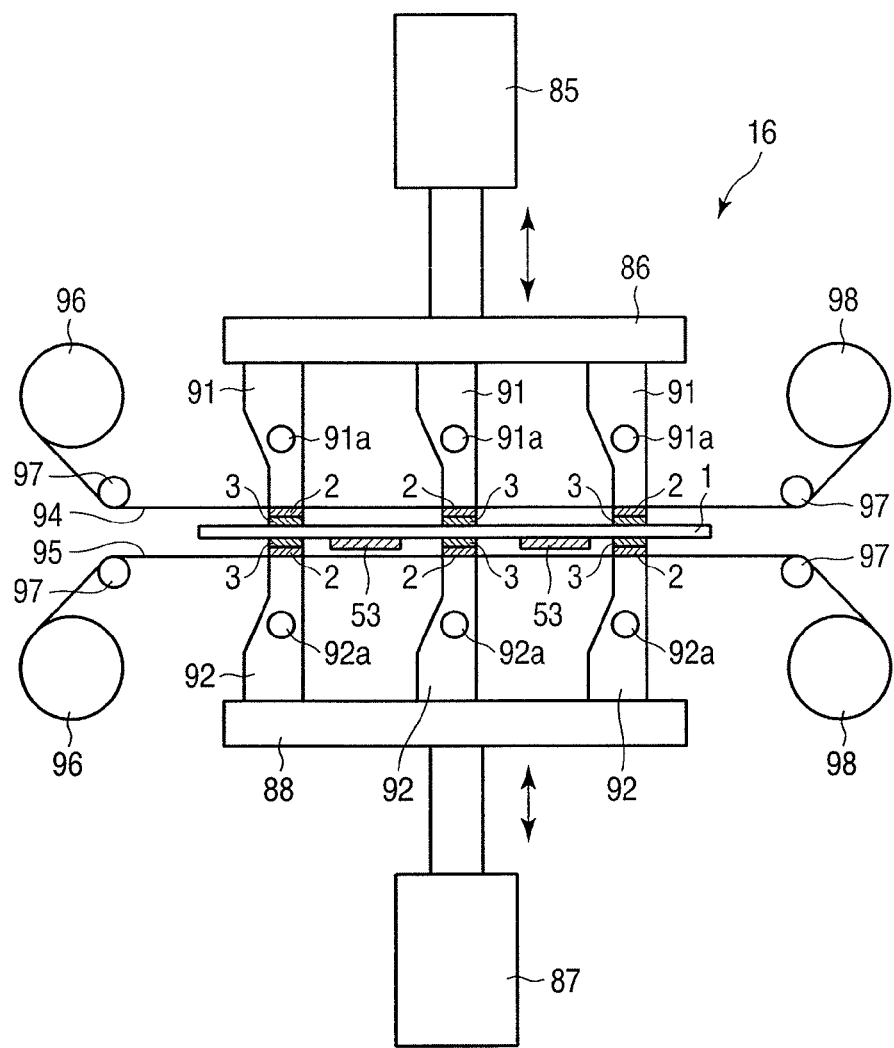
FIG. 12 is a side view showing the structure of main pressure-bonding means.

The main pressure-bonding means 16, as shown in FIG. 12, includes a plate-shaped upper movable member 86 which is disposed above the endless belts 53 of the convey means 14 and is vertically moved by an upper cylinder 85, and a plate-shaped lower movable member 88 which is disposed below and is vertically moved by a lower cylinder 87.

Three upper pressing tools 91, which are heated by heaters 91*a*, are provided on a lower surface of the upper movable member 86 at predetermined intervals which are described below. Three lower pressing tools 92, which are heated by heaters 92*a*, are provided on an upper surface of the lower movable member 88 at positions corresponding to the upper pressing tools 91.

Incidentally, the upward and downward driving of the upper pressing tools 91 and lower pressing tools 92 by the cylinders 85 and 87 can be performed in two-stage strokes.

The pressing tools 91 and 92 are provided at intervals corresponding to the three lead wires 2 which are provisionally pressure-bonded on the upper and lower surfaces of the semiconductor cell 1. An upper cushion tape 94 is provided between the upper pressing tools 91 and the upper surface of the semiconductor cell 1, and a lower cushion tape 95 is provided between the lower pressing tools 92 and the lower surface of the semiconductor cell 1.

The respective cushion tapes 94 and 95 are led out of feed reels 96, guided by pairs of guide rollers 97 to run in parallel with the upper surface and lower surface of the semiconductor cell 1, and are wound around take-up reels 98.

Although not shown in detail, the upper-side and lower-side feed reels 96, guide rollers 97 and take-up reels 98 are configured to vertically move as integral units with the upper-side and lower-side pressing tools 91 and 92.

If the string 1A is conveyed and the first, fifth and ninth semiconductor cells 1 are positioned to the three main pressure-bonding means 16, the upper pressing tools 91 of the respective main pressure-bonding means 16 are driven downward, and the lower pressing tools 92 are driven upward. Thereby, the three lead wires 2, which are provisionally pressure-bonded to the upper and lower surfaces of the first, fifth and ninth semiconductor cells 1 of the string 1A, are heated while being pressed.

Thereby, since the conductive tapes 3, which attach the lead wires 2 to the semiconductor cell 1, are melted and cured by the heat of the upper and lower pressing tools 91 and 92, the lead wires 2 are mainly pressure-bonded to the upper and lower surfaces of the semiconductor cell 1. Specifically, the lead wires 2 are mainly pressure-bonded to the upper and lower surfaces of the semiconductor cell 1 at the same time, that is, at the same timing.

Incidentally, the upward driving and downward driving of the upper pressing tools 91 and lower pressing tools 92 by the cylinders 85 and 87 at the time of the main pressure-bonding are performed by a smaller stoke or the two-stage strokes. Thereby, the tact time needed for the main pressure-bonding can be shortened.

In this manner, if the lead wires 2 are mainly pressure-bonded to the first, fifth and ninth semiconductor cells 1 of the string 1A, the string 1A is intermittently conveyed by one pitch P. Thereby, the second, sixth and tenth semiconductor cells 1 are opposed and positioned to the three main pressure-bonding means 16.

Then, if such an operation is repeated four times that the three main pressure-bonding means 16 are operated to mainly pressure-bond the lead wires 2 to the semiconductor cells 1 and thereafter the string 1A is intermittently conveyed by the pitch P to perform main pressure-bonding, all the lead wires 2, which are provisionally pressure-bonded to the 12 semiconductor cells 1, can be mainly pressure-bonded.

The string 1A, in which all lead wires 2 that are connected to the 12 semiconductor cells 1 have been mainly pressure-bonded in this manner, is conveyed out from the convey means 14 by the discharge means 17 and is stored in the stocker 19.

When the string 1A is conveyed out by the discharge means 17, the upper pressing tools 91 and lower pressing tools 92 of the respective main pressure-bonding means 16 are driven by the large stroke of the cylinders 85 and 87.

Thereby, since the distance between the upper pressing tools 91 and the lower pressing tools 92 can be sufficiently increased, suction pads 105 of the discharge means 17 can surely be inserted between the upper pressing tools 91 and lower pressing tools 92.

The discharge means 17, as shown in FIG. 13, includes a horizontal movable member 101 which is formed to have a length dimension corresponding to the string 1A. The horizontal movable member 101 is configured to be moved in the Y direction by a plurality of horizontal cylinders 102, for example, two horizontal cylinders 102, between a position where the horizontal movable member 101 retreats from above the convey means 14, that is, a position where the horizontal movable member 101 stands by above the stocker 19, as indicated by a solid line in FIG. 13, and a position where the horizontal movable member 101 faces the upper side of the convey means 14, as indicated by a chain line.

As shown in FIG. 13 and FIG. 14, on the lower surface of the horizontal movable member 101, a vertical movable member 104 is provided so as to be vertically movable by a plurality of vertical cylinders 103. The vertical movable member 104 is provided with a plurality of sets of suction pads 105, that is, 12 sets of suction pads 105 (only two are shown in FIG. 14), each set comprising four suction pads 105 and sucking and holding the four corner portions of each semiconductor cell 1 of the string 1A, the axes of the suction pads 105 being set to be vertical. Each of the suction pads 105 is connected to a suction pump (not shown) and produces a suction force.

When the lead wires 2 of the 12 semiconductor cells 1 of the string 1A have completely been mainly pressure-bonded, the horizontal movable member 101 is driven by the horizontal cylinder 102 and positioned above the string 1A over the convey means 14.

Then, the vertical cylinders 103 operate to drive the vertical movable member 104 downward. Thereby, the four corner portions of the upper surface of each of the 12 semiconductor cells 1 are sucked by each set of four suction pads 105 which are provided on the vertical movable member 104.

If the suction pads 105 suck the semiconductor cells 1, the vertical movable member 104 rises, and the horizontal movable member 101 is driven in the retreat direction that is the +Y direction and positioned above the inspection module 18. The string 1A is fed to the inspection module 18, and the connection state of the lead wires 2, which are connected to the upper and lower surfaces of the string 1A, are inspected. After the presence/absence of defects is checked by the inspection, the string 1A is stored in the stocker 19 which is provided in the +Y direction, which is the backward direction of the inspection module 18.

The string 1A, in which 12 semiconductor cells 1 are connected in series, is finally required to have a preset generation power. Meanwhile, there is a variance in generation power between the individual semiconductor cells 1. Taking this into account, semiconductor cells 1 with different generation powers are provided in the first storage 21 and second storage 22 of the feed module 12.

When the string 1A with a preset generation power is to be constructed, the number of semiconductor cells 1 from the first storage 21 of the feed module 12 and the number of semiconductor cells 1 from the second storage 22, which are fed to the tape attaching means 13, are set in accordance with the required generation power of the string 1A. Thereby, the string 1A with the desired generation power can be constructed.

Specifically, by the first and second storages 21 and 22 being provided in the feed module 12, the generation power of the string 1A can be set at a required generation power even if the output powers of the individual semiconductor cells 1 are different.

As has been described above, according to the lead wire connection apparatus with the above structure, when the conductive tapes 3, which are cut to a predetermined length, are attached to the upper and lower surfaces of the semiconductor cell 1, the conductive tapes 3 are simultaneously attached to the upper and lower surfaces of the semiconductor cell 1.

Thus, when the conductive tapes 3 are attached to the semiconductor cell 1, the attachment can be carried out without bending the semiconductor cell 1 upward or downward. Therefore, the occurrence of a crack in the semiconductor cell 1 can be prevented. Moreover, since the conductive tapes 3 can be attached simultaneously to the upper and lower surfaces of the semiconductor cell 1, the productivity can be enhanced and the apparatus structure can be reduced in size, compared to the case of performing attachment individually.

When the lead wires 2, which are forming-processed to have a predetermined shape, are provisionally pressure-bonded to the semiconductor cells 1 on which the conductive tapes 3 are attached, the provisional pressure-bonding is performed simultaneously on the upper and lower surfaces of the semiconductor cell 1.

Thus, also by this, the provisional pressure-bonding can be carried out without bending the semiconductor cell 1 upward or downward. Therefore, the occurrence of a crack in the semiconductor cell 1 can be prevented. Moreover, since the lead wires 2 can be provisionally pressure-bonded simultaneously to the upper and lower surfaces of the semiconductor cell 1, the productivity can be enhanced and the apparatus structure can be simplified, compared to the case of performing provisional pressure-bonding individually.

When the lead wires 2, which have been provisionally pressure-bonded to the upper and lower surfaces of the semiconductor cells 1, are mainly pressure-bonded, the main pressure-bonding is performed simultaneously on the upper and lower surfaces of the semiconductor cell 1.

Thus, also by this, the main pressure-bonding can be carried out without bending the semiconductor cell 1 upward or downward. Therefore, the occurrence of a crack in the semiconductor cell 1 can be prevented. Moreover, since the lead wires 2 can be mainly pressure-bonded simultaneously to the upper and lower surfaces of the semiconductor cell 1, the productivity can be enhanced and the apparatus structure can be simplified, compared to the case of performing main pressure-bonding individually.

Besides, in the case of the main pressure-bonding, since the semiconductor cell 1 is heated at high temperatures by the heaters 91a provided on the upper pressing tools 91 and the heaters 92a provided on the lower pressing tools 92, there is concern that thermal deformation or thermal strain occurs in the semiconductor cell 1.

However, at the time of the main pressure-bonding of the lead wires 2, the upper and lower surfaces of the semiconductor cell 1 are heated simultaneously and uniformly under the same condition by the three upper pressing tools 91 and lower pressing tools 92. Thus, even if the semiconductor cell 1 is heated by the pressing tools 91 and 92, thermal deformation or thermal strain hardly occurs in the semiconductor cell 1.

In addition, if the string 1A is formed by connecting the plural semiconductor cells 1 by the lead wires 2 in a row at intervals of pitch P, the lead wires 2 connected to the plural semiconductor cells 1 are mainly pressure-bonded simultaneously by the plural main pressure-bonding means 16 which are arranged at intervals corresponding to an integer multiple of the pitch P of the semiconductor cell 1. Then, after the main pressure-bonding, the string 1A is intermittently conveyed with the pitch P, and the main pressure-bonding by the plural main pressure-bonding means 16 is repeated a plurality of times.

Therefore, the main pressure-bonding of the lead wires 2, which have been provisionally pressure-bonded to the plural semiconductor cells 1, can be performed and efficiently by the plural main pressure-bonding means 16.

Next, other embodiments of the present invention are described. The same parts as those in the first embodiment are denoted by the same reference numerals, and a description thereof is omitted.

FIG. 16 to FIG. 19 show a second embodiment of the invention. The second embodiment is a modification of convey means 114. The convey means 114 includes, like the first embodiment, two endless belts 53 of steel which are passed between a driving pulley 54 and a driven pulley 55. Suction holes 53a, which penetrate the endless belts 53 in the thickness direction, are provided at predetermined intervals.

As shown in FIG. 16, a strip-shaped block 115 is disposed under a lower surface of a part of each endless belt 53 on the upper side of endless run, such that the upper surface of the block 115 is in contact with the lower surface of the endless belt 53. That part of the block 115, which corresponds to the main pressure-boding means 16 for mainly pressure-bonding the lead wires 2 to the semiconductor cell 1, is removed. In short, the block 115 is divided into two parts at a main pressure-bonding position B corresponding to the main pressure-bonding means 16.

Like the first embodiment, a suction conduit 58 is formed in each block 115. A plurality of branch ports 58a, which communicate with the suction holes 53a formed in the endless belt 53, are formed in the suction conduit 58. Like the first embodiment, a suction pump 59 (not shown in FIG. 16) is connected to the suction conduit 58.

Thereby, the semiconductor cells 1, which are fed onto the endless belts 53, are held by a suction force occurring in the suction holes 53a via the branch ports 58a.

At the main pressure-bonding position B where the block 115 is divided, a backup tool 116 is provided in place of the lower pressing tool 92 of the first embodiment, in such a manner that the upper surface of the backup tool 116 is slightly lower than the lower surface of the endless belt 53.

As shown in FIG. 18, a pair of grooves 116a are formed in the upper surface of the backup tool 116 at positions corresponding to the endless belts 53, the grooves 116a being configured to prevent the endless belts 53 from abutting upon the upper surface of the backup tool 116.

Like the first embodiment, above the backup tool 116, three upper pressing tools 91, which are attached to the lower surface of an upper movable member 86 that is vertically driven by an upper cylinder 85, are provided so as to be opposed to the backup tool 116.

The backup tool 116 is provided with a heater 116b, and the upper pressing tools 91 are provided with heaters 91a.

Accordingly, after the semiconductor cell 1, on the upper and lower surfaces of which the lead wires 2 have been provisionally pressure-bonded by the conductive tapes 3, is conveyed and positioned to the main pressure-bonding position B, if the upper pressing tools 91 are driven downward, the lead wires 2, which are provisionally pressure-bonded to the upper and lower surfaces of the semiconductor cell 1, are mainly pressure-bonded at the same time.

In the meantime, like the upper pressing tools 91, the backup tool 116 may be divided into three, and may be provided to be opposed to the upper pressing tools 91, between the paired endless belts 53 and on both sides thereof.

As shown in FIG. 19, a width dimension W1 of a pressing surface 91b of the upper pressing tool 91 for mainly pressure-bonding the lead wires 2 to the semiconductor cell 1 is set to be smaller than a width dimension W2 of the lead wire 2. A width dimension W3 of each of the conductive tapes 3 provided on the upper and lower surfaces of the semiconductor cell 1 is set to be smaller than the width dimension W2 of the lead wire 2.

By this setting, even if the lead wire 2 is pressed and heated by the pressing surface 91b of the upper pressing tool 91 at the time of main pressure-bonding and the conductive tape 3 is melted, the lead wire 2, which has the larger width dimension than the pressing surface 91b, prevents the molten portion from rising toward the pressing tool 91 and adhering to the pressing surface 91b.

Thereby, since the molten portion is prevented from adhering to the pressing surface 91b, there is no need to provide a cushion tape, as in the first embodiment, between the lead wire 2 and the pressing surface 91b.

Incidentally, even when the width dimension W3 of the conductive tape 3 is equal to the width dimension W2 of the lead wire 2 or is greater than the width dimension W2 of the lead wire 2, if the width dimension W1 of the pressing surface 91a is less than the width dimension W2 of the lead wire 2, the molten portion is prevented from adhering to the pressing surface 91a.

Figure 17:
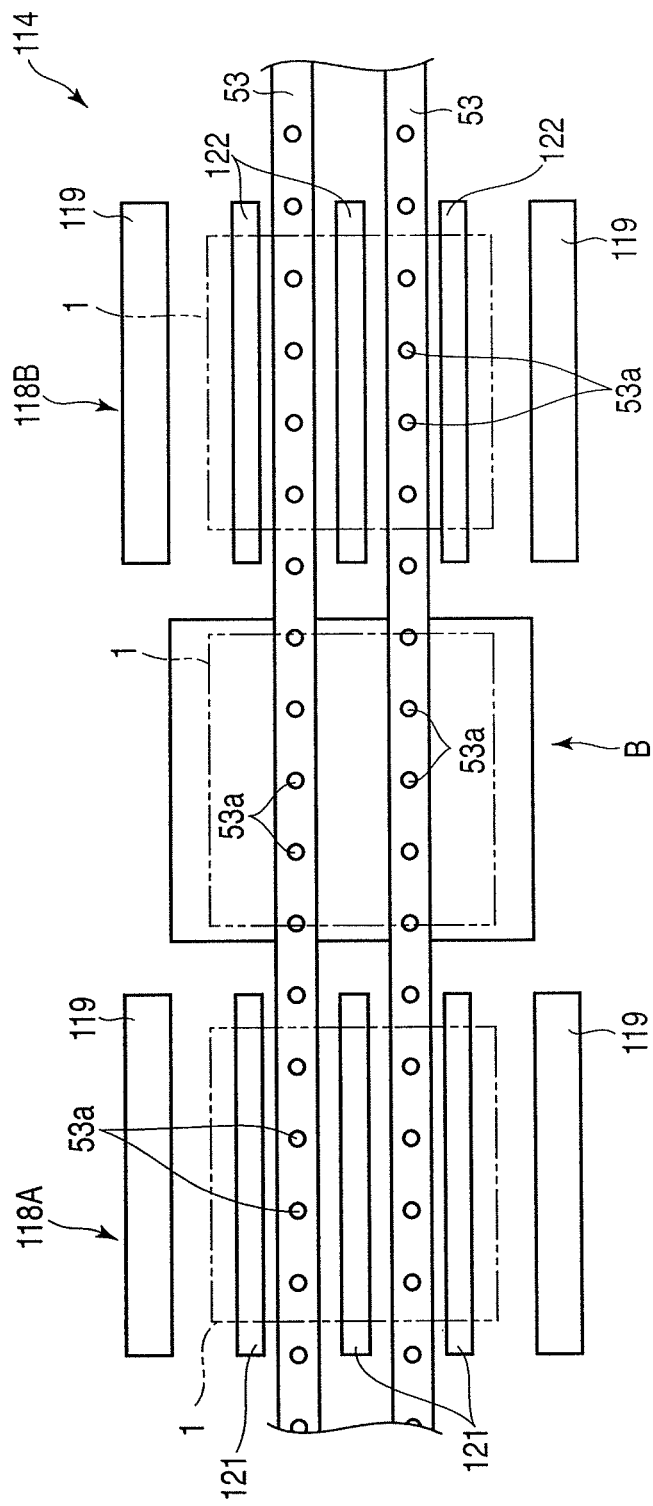
FIG. 17 is a plan view of the convey means shown in FIG. 16.

As shown in FIG. 17, first and second gauge mechanisms 118A and 118B, which press and position both sides of the semiconductor cell 1 that has been conveyed by the endless belts 53, are provided on the upstream side and downstream side of the main pressure-bonding position B. Each gauge mechanism 118A, 118B includes a pair of pressing members 119 which are opened/closed by a driving source (not shown), that is, which are opened/closed in a direction crossing the convey direction of the semiconductor cell 1 that is conveyed.

Specifically, the semiconductor cell 1 is positioned on the endless belts 53 in the direction crossing the convey direction, at a position before the semiconductor cell 1 is conveyed and positioned to the main pressure-bonding position B and at a position after the lead wires 2 are mainly pressure-bonded at the main pressure-bonding position B. Accordingly, when a plurality of semiconductor cells 1 are connected in a row, the semiconductor cells 1 can be connected without causing skew of the semiconductor cells 1.

On the upstream side of the main pressure-bonding position B, three divided pre-heaters 121, which pre-heat the semiconductor cell 1 that is to be conveyed and fed to the main pressure-bonding position B, are provided between the paired endless belts 53 and on the outsides thereof.

On the downstream side of the main pressure-bonding position B, three divided slow-cooling heaters 122 for slow-cooling the semiconductor cell 1, on which the lead wires 2 have been mainly pressure-bonded at the main pressure-bonding position B and conveyed out, are provided, like the pre-heaters 121, between the paired endless belts 53 and on the outsides thereof.

Thereby, when the lead wires 2 are mainly pressure-bonded to the semiconductor cell 1, since the semiconductor cell 1 has been pre-heated by the pre-heaters 121, a sharp temperature rise can be avoided. In addition, since the temperature of the semiconductor cell 1, on which the lead wires 2 have been mainly pressure-bonded, is slowly lowered by the slow-cooling heaters 122, a sharp temperature drop can be avoided.

In this manner, since a sharp temperature variation of the semiconductor cell 1 is avoided, when the lead wires 2 are mainly pressure-bonded, the occurrence of strain, a chip or a crack in the semiconductor cell 1 can be prevented.

As the pre-heaters 121 and slow-cooling heaters 122, use may be made of electric heaters, infrared heaters or other heat sources, and the kind of heaters is not restricted.

Usually, the temperature of the semiconductor cell 1 rises up to about 80° C. by the provisional pressure-bonding of lead wires 2 by the provisional pressure-bonding means 15, and rises up to 120 to 180° C., to be specific, up to about 180° C. in this embodiment, by the main pressure-bonding of the lead wires 2 by the main pressure-bonding means 16. Thus, the semiconductor cell 1 may be pre-heated in a range of from about 80° C. to 140-150° C. by the pre-heaters 121, and may be slow-cooled in a range of from about 180° C. to 150° C. by the slow-cooling heaters 122.

A plurality of pre-heaters 121 and slow-cooling heaters 122 may be provided in the direction of conveyance of the semiconductor cell 1, and the temperature management of the semiconductor cell 1 may be performed more finely.

Although the description has been given of the case in which the pre-heating and slow-cooling are performed by providing only one pre-heater 121 and one slow-cooling heater 122 in the direction of conveyance of the semiconductor cell 1. However, it is possible to pre-heat and slow-cool the semiconductor cell 1 in a stepwise manner by providing a plurality of pre-heaters 121 and slow-cooling heaters 122 in the direction of conveyance of the semiconductor cell 1. For example, if the semiconductor cell 1 is pre-heated and slow-cooled in steps of 20° C., it is possible to surely prevent the occurrence of strain, a chip or a crack of the semiconductor cell 1.

FIG. 20 shows a third embodiment of the present invention. In the first embodiment, neighboring semiconductor cells 1 are connected by three lead wires 2. However, there are cases in which the semiconductor cells 1 are connected by two lead wires 2, depending on the size, etc. of the semiconductor cells 1.

Taking this into account, in the third embodiment, three upper pressing tools 191, which mainly pressure-bond three lead wires 2 to the semiconductor cell 1, are configured, as shown in FIG. 20, so that the lead wires 2 can be mainly pressure-bonded whether the number of lead wires 2 is three or two.

Specifically, the three upper pressing tools 191 are juxtaposed, and the pressing tool 191 which is positioned at the center has one pressing surface, namely a first pressing surface 191a. Each of the two upper pressing tools 191, which are positioned on both sides, has a first pressing surface 191a which is located on the outside in the direction of juxtaposition, and a second pressing surface 191b which is located on the inside in the direction of juxtaposition.

The interval of the three first pressing surfaces 191a is set to be equal to the interval of three lead wires 2 at the time of mainly pressure-bonding the three lead wires 2 to the semiconductor cell 1. The interval of the two second pressing surfaces 191b is set to be equal to the interval of two lead wires 2 at the time of mainly pressure-bonding the two lead wires 2 to the semiconductor cell 1.

Each of the upper pressing tools 191 is provided with a heater 191c.

When three lead wires 2 are mainly pressure-bonded to the semiconductor cell 1, the first pressing surfaces 191a of the three upper pressing tools 191 press the lead wires 2. At this time, since the first pressing surfaces 191a of the upper pressing tools 191 press the lead wires 2, the second pressing surfaces 191b of the two pressing tools 191 positioned on both sides do not press the plate surface of the semiconductor cell 1 because of the thickness of the lead wires 2.

Similarly, when two lead wires 2 are mainly pressure-bonded to the semiconductor cell 1, the second pressing surfaces 191b of the two upper pressing tools 191 press the lead wires 2. At this time, since the second pressing surfaces 191b of the upper pressing tools 191 press the lead wires 2, the first pressing surfaces 191a of the pressing tools 191 do not press the plate surface of the semiconductor cell 1 because of the thickness of the lead wires 2.

Specifically, of the three juxtaposed upper pressing tools 191, the two upper pressing tools 191 positioned on both sides are provided with the first and second pressing surfaces 191a and 191b, and the central upper pressing tool 191 is provided with only the first pressing surface 191a. Thereby, it is possible to adapt to either the case where the number of lead wires that are mainly pressure-bonded to the semiconductor cell 1 is three, or the case where the number of lead wires is two.

In this embodiment, the description has been given of, by way of example, the case in which the embodiment is applied to the main pressure-bonding means 16. However, the embodiment is also applicable to the provisional pressure-bonding means 15.

In addition, the description has been given, by way of example, of the case in which the upper surface of the semiconductor cell 1 is pressed by the upper pressing tools 191 and the lower surface thereof is pressed by the backup tool 116. However, in the case where the lower surface of the semiconductor cell 1 is pressed by the lower pressing tools 92, as shown in the first embodiment, in place of the backup tool 116, the lower pressing tools 92 may be configured to have the same structure as the upper pressing tools 191.

FIG. 21 shows a fourth embodiment of the invention. In this embodiment, the length dimension of an upper pressing tool 291 or a lower pressing tool (not shown) can be varied in accordance with the length dimension of the semiconductor cell 1.

Specifically, at both end portions in the longitudinal direction of a pressing surface 291a of each pressing tool 291, chips 124 can detachably be attached and fixed to a main body part of the pressing tool 291, for example, by coupling means such as dovetail coupling, as indicated by a chain line, from a detached position indicated by a solid line in FIG. 21.

If the chips 124 are attached to both end portions in the longitudinal direction of the pressing surface 291a of the pressing tool 291, the lower surfaces of the chips 124 constitute parts of the pressing surface. Accordingly, if the chips 124 are attached to the pressing tool 291, the pressing surface 291a can be increased in length, and if the chips 124 are detached, the pressing surface 291a can be shortened.

For example, when the lead wire 2 are mainly pressure-bonded to a short-sized semiconductor cell 1, if the pressing surface 291a has a long size, a front end portion and a rear end portion of the pressing surface 291a press, in some cases, end portions in the direction of conveyance of preceding and subsequent semiconductor cells 1. In such cases, there is concern that the semiconductor cells 1, which have been partly pressed by the pressing surface 291a, may be damaged.

Thus, when the length dimension of the semiconductor cell 1 is short, as described above, the chips 124 are detached from the pressing tool 291, and the pressing surface 291a is shortened. Thereby, the preceding and subsequent semiconductor cells 1 can be prevented from being damaged.

Industrial Applicability

According to the present invention, conductive tapes are attached simultaneously to the upper and lower surfaces of a semiconductor cell, and also provisional pressure-bonding and main pressure-bonding of lead wires to the conductive tapes attached to the semiconductor cell are performed simultaneously on the upper and lower surfaces thereof.

Therefore, since non-uniform pressing force or heat hardly acts on the semiconductor cell at the time of attachment of the conductive tapes or at the time of provisional pressure-bonding and main pressure-bonding of the lead wires, it is possible to prevent the semiconductor cell from being damaged, or to prevent deformation or strain from occurring due to heat.

What is claimed is:

1. A lead wire connection apparatus which connects a plurality of semiconductor cells in a row by lead wires, comprising:
    a feed module which feeds the semiconductor cells;
    tape attaching means for simultaneously attaching adhesive, electrically conductive tapes, which are cut to a predetermined length, to an upper surface and a lower surface of the semiconductor cell which is fed from the feed module;
    convey means to which the semiconductor cell, to the upper surface and lower surface of which the conductive tapes have been attached by the tape attaching means, is fed, and which pitch-feeds the semiconductor cell;
    lead wire processing means for forming-processing the lead wire in such a shape that the lead wire is bent upward and downward at an intermediate portion in a longitudinal direction of the lead wire;
    provisional pressure-bonding means which is provided at a part opposed to the semiconductor cell that is pitch-fed by the convey means, holds the lead wires, which are forming-processed by the lead wire processing means, repeats provisional pressure-bonding of the lead wires to the conductive tapes provided on the upper surface and lower surface of the semiconductor cell that is pitch-fed, and electrically connects, alternately, the upper surfaces and lower surfaces of the neighboring semiconductor cells; and
    main pressure-bonding means which is disposed at a part opposed to the semiconductor cell on a downstream side of the provisional pressure-bonding means in a direction of conveyance of the semiconductor cell by the convey means, and which mainly pressure-bonds, simultaneously, the paired upper and lower lead wires which have been provisionally pressure-bonded to the upper surface and lower surface of the semiconductor cell by the provisional pressure-bonding means.

2. The lead wire connection apparatus of semiconductor cells, according to claim 1, further comprising a first tape attachment module and a second tape attachment module to which the semiconductor cells are alternately fed from the feed module.

3. The lead wire connection apparatus of semiconductor cells, according to claim 1, wherein inspection means for checking non-defectiveness/defectiveness of an attachment state of the conductive tapes attached to the semiconductor cell by the tape attaching means, is provided between the tape attaching means and the convey means.

4. The lead wire connection apparatus of semiconductor cells, according to claim 1, wherein the provisional pressure-bonding means comprises:
    a lower pressing member which is disposed at a position facing the lower surface of the semiconductor cell which is conveyed by the convey means, the lower pressing member including, at an upper end thereof, a reception surface for suction-holding the lead wire which is forming-processed by the lead wire processing means, and the lower pressing member being vertically driven; and
    an upper pressing member which is provided to be horizontally and vertically movable above the semiconductor cell, suction-holds the lead wire, which is forming-processed by the lead wire processing means, by a holding surface formed at a lower end of the upper pressing member, and feeds the lead wire onto the reception surface of the lower pressing member, the upper pressing member performing provisional pressure-bonding by simultaneously pressing, together with the lower pressing member, the lead wires attached to the conductive tapes on the upper surface and lower surface of the semiconductor cell, by the feed of the lead wires and the pitch-feed of the semiconductor cells by the convey means.

5. The lead wire connection apparatus of semiconductor cells, according to any one of claim 1, wherein the main pressure-bonding means comprises:
    a lower main pressure-bonding head provided to be vertically movable at a part opposed to the lower surfaces of the semiconductor cells which are connected in the row by the provisionally pressure-bonded lead wires and are conveyed by the convey means; and
    an upper main pressure-bonding head provided to be vertically movable at a part facing the upper surface of the semiconductor cell and the lower main pressure-bonding head, the upper main pressure-bonding head performing main pressure-bonding by simultaneously pressing, together with the lower main pressure-bonding head, the conductive tapes which are provisionally pressure-bonded to the upper surface and lower surface of the semiconductor cell.

6. The lead wire connection apparatus of semiconductor cells, according to claim 1, wherein a plurality of the main pressure-bonding means are arranged in the direction of conveyance of the semiconductor cells by the convey means, at an interval corresponding to an integer multiple of an interval of the semiconductor cells which are connected in the row,
    the convey means pitch-feeds the semiconductor cells connected in the row, with a distance equal to the interval of connection of the semiconductor cells, and
    the plurality of the main pressure-bonding means simultaneously mainly pressure-bond the lead wires which are provisionally pressure-bonded to the upper surfaces and lower surfaces of the plural semiconductor cells, each time the plural semiconductor cells are pitch-fed.

7. The lead wire connection apparatus of semiconductor cells, according to claim 1, wherein there is provided discharge means for simultaneously sucking the plural semiconductor cells to which the lead wires have been mainly pressure-bonded by the main pressure-bonding means, and discharging the semiconductor cells to a lateral side of the convey means.

8. The lead wire connection apparatus of semiconductor cells, according to claim 1, further comprising a pre-heater which pre-heats the semiconductor cell that is conveyed in by the main pressure-bonding means, and a slow-cooling heater which slow-cools the semiconductor cell to which the lead wires are mainly pressure-bonded by the main pressure-bonding means and is conveyed out from the main pressure-bonding means.

9. The lead wire connection apparatus of semiconductor cells, according to claim 1, further comprising a gauge mechanism which positions the semiconductor cell, to which the lead wires are yet to be mainly pressure-bonded by the main pressure-bonding means, in relation to the convey means in a direction crossing the direction of conveyance.

10. The lead wire connection apparatus of semiconductor cells, according to claim 1, wherein the main pressure-bonding means includes a pressing tool which mainly pressure-bonds the lead wire which has been provisionally pressure-bonded to the semiconductor cell, and a width dimension of a pressing surface of the pressing tool, which presses the lead wire, is set to be smaller than a width dimension of the lead wire.

11. The lead wire connection apparatus of semiconductor cells, according to claim 1, wherein the main pressure-bonding means includes three juxtaposed pressing tools, a first pressing surface is formed on the pressing tool which is positioned at a center in a direction of juxtaposition, and a first pressing surface and a second pressing surface are formed on each of the two pressing tools which are positioned on both sides, the main pressure-bonding means being configured such that when the number of lead wires, which connect the plural semiconductor cells in the row, is three, the lead wires are pressed by the first pressing surfaces of the three pressing tools, and when the number of lead wires is two, the lead wires are pressed by the second pressing surfaces of the two pressing tools which are position on both sides.

12. The lead wire connection apparatus of semiconductor cells, according to claim 1, wherein the main pressure-bonding means includes a pressing tool which mainly pressure-bonds the lead wires which have been provisionally pressure-bonded to the semiconductor cell, and chips for adjusting a length dimension of a pressing surface of the pressing tool, which presses the lead wires, are detachably provided on both end portions in a longitudinal direction of the pressing surface of the pressing tool.

* * * * *